United States Patent
Kannan et al.

(10) Patent No.: US 9,811,610 B2
(45) Date of Patent: Nov. 7, 2017

(54) SYSTEMS AND METHODS FOR BEVEL FEATURE RECOGNITION AND BEVEL PROFILE GENERATION

(71) Applicant: HCL TECHNOLOGIES LIMITED, New Delhi (IN)

(72) Inventors: Thoguluva Ramamoorthy Kannan, Chennai (IN); Romesh Agrawal, Pune (IN)

(73) Assignee: HCL Technologies Limited, New Delhi (IN)

( * ) Notice: Subject to any disclaimer, the term of this patent is extended or adjusted under 35 U.S.C. 154(b) by 405 days.

(21) Appl. No.: 14/631,040

(22) Filed: Feb. 25, 2015

(65) Prior Publication Data

US 2016/0246897 A1    Aug. 25, 2016

(51) Int. Cl.
*G06F 17/50* (2006.01)

(52) U.S. Cl.
CPC .......... *G06F 17/50* (2013.01); *G06T 2210/00* (2013.01)

(58) Field of Classification Search
USPC .......................... 703/2, 5; 345/420; 74/459.5
See application file for complete search history.

(56) References Cited

U.S. PATENT DOCUMENTS

| | | | |
|---|---|---|---|
| 5,341,699 A * | 8/1994 | Rouverol | F16H 55/08 74/462 |
| 6,597,355 B1 | 7/2003 | Kulkarni | |
| 6,760,038 B2 | 7/2004 | Venkataraman et al. | |
| 7,042,451 B2 | 5/2006 | Venkataraman et al. | |
| 8,773,431 B2 * | 7/2014 | Joshi | G06T 17/00 345/420 |
| 9,636,795 B2 * | 5/2017 | Kikuchi | B24B 9/144 |
| 2010/0140498 A1 * | 6/2010 | Jau | H01J 37/20 250/442.11 |
| 2013/0120376 A1 * | 5/2013 | Joshi | G06T 17/00 345/420 |
| 2013/0124148 A1 * | 5/2013 | Jin | G06F 17/5086 703/1 |

OTHER PUBLICATIONS

Kusiak, Computational Intelligence in Design and Manufacturing, 1992, pp. 71, 72, Wiley, CA.

(Continued)

*Primary Examiner* — Thai Phan
(74) *Attorney, Agent, or Firm* — Brooks Kushman P.C.

(57) ABSTRACT

Methods to automatically recognize bevel features and bevel chains in inner bounding loops and outer bounding loops of walls and bends in sheet metal models or on solid models are disclosed, which may be used for computer aided design, manufacturing, DFX, costing, etc. Recognition methods of various types of bevels and classification of bevels as V-bevel, inverted V-bevel, Y-bevel, inverted Y-bevel, X-bevel, K-bevel, generic bevels and different types of vertex bevels are disclosed. Bevel chain recognition methods that assemble the same type of bevels into bevel chains and identify the bevel chains as tangential bevel chains, non-tangential bevel chains and mixed bevel chains based on the connectivity between the bevels are disclosed. Methods to generate bevel profiles that may be used for feature recreation, feature suppression, or tool path generation for cutting features for manufacturing are disclosed.

20 Claims, 25 Drawing Sheets

(56) References Cited

OTHER PUBLICATIONS

Shah, Parametric and Feature-Based CAD/CAM: Concepts, Techniques, and Applications, 1995, p. 97, Wiley, CA.
Qiang et al., Machine Interpretation of CAD Data for Manufacturing Applications, 1997, pp. 264-311, vol. 24, No. 3, University of Arizona, Tucson.
Kannan, An Integrated Planner for Manufacture of Sheet Metal components Using Step AP-203, Thesis submitted for the award of the degree of Doctor of Philosophy, 2007, Manufacturing Engineering Section Department of Mechanical Engineering Indian Institute of Technology Madras Chennai, India.

* cited by examiner

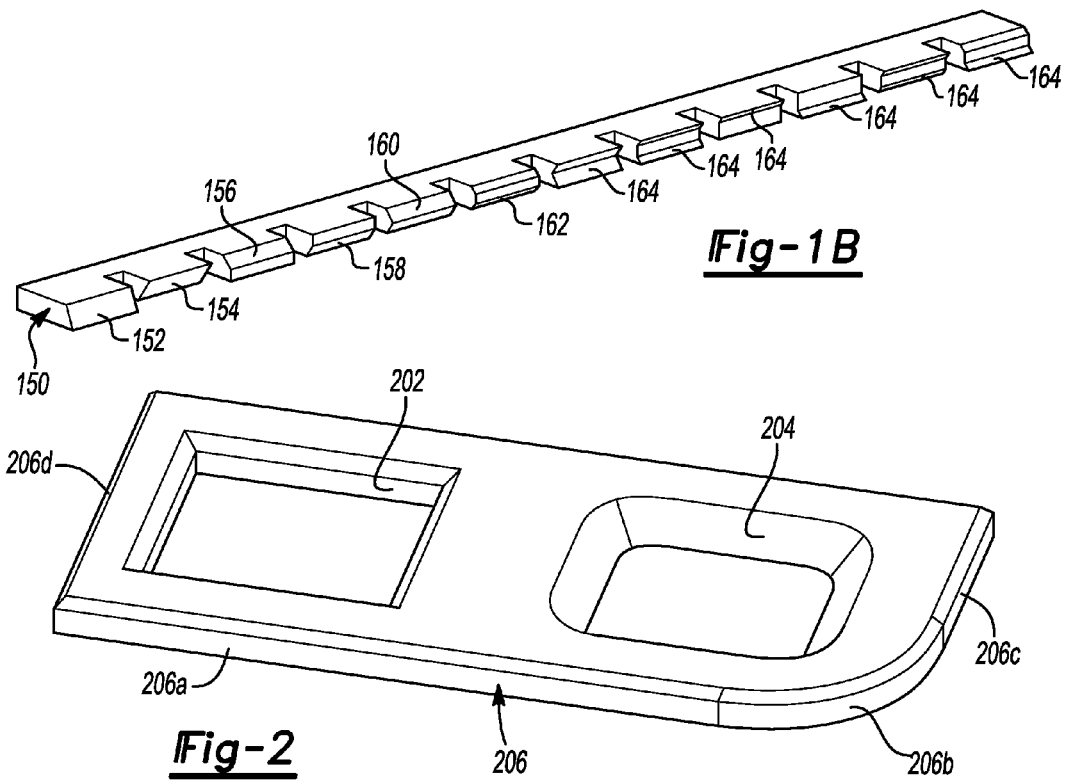
*Fig-1B*
*Fig-2*
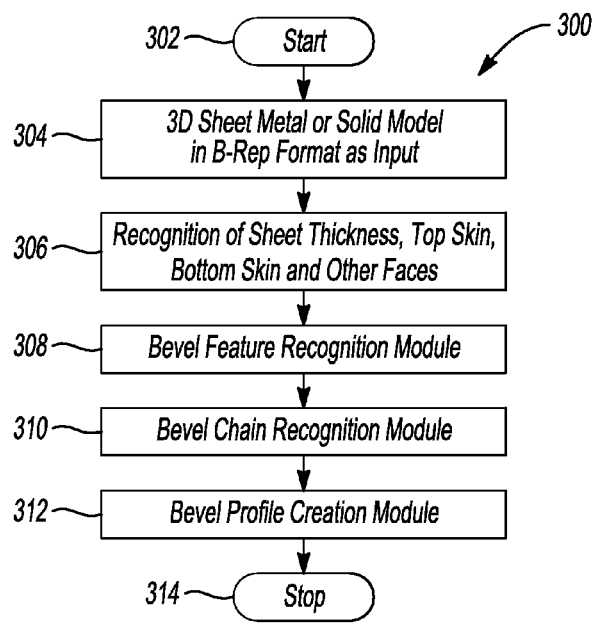
*Fig-3*

SYSTEMS AND METHODS FOR BEVEL FEATURE RECOGNITION AND BEVEL PROFILE GENERATION

TECHNICAL FIELD

The present disclosure relates generally to methods for recognizing features from three-dimensional models for application in various domains, such as design, analysis, manufacturing, prototyping, manufacturability analysis, assembly, costing, sustainability, etc., in which such features may be of use.

BACKGROUND

Manufacturing methods and processes for a part may involve cutting and forming operations. Manufacturing process such as sheet metal cutting may include tool heads like laser, waterjet, plasma, flame cutting machines, etc., used for two dimensional (2D) cutting of flat sheets and for three dimensional (3D) cutting. Bevel cutting in thick sheets and plates may be achieved either by manually tilting a tool head in 2D machines or by programmatically controlled tool head in a 3D machines. Bevels may also be machined by milling tools and other means.

Metal cutting machines are evolving day by day and are driving demand to improve automation of manufacturing systems and methods to enhance end user productivity with computer aided software tools and computer numerical control (CNC) machine tools. Computer aided design (CAD) and computer aided manufacturing (CAM) tools may provide an effective means to conceive and manufacture parts. Designs may be developed in 3D CAD and the same data may be used in CAM to produce tool paths for manufacturing different types of parts. A 3D model may contain various types of features. Features are local regions in a 3D model, consisting of a set of faces that provide information required for performing a specific task in designing, manufacturing, costing, etc.

3D modeling is performed in feature based design systems by a combination of various design features that add and subtract volumes to obtain the desired final shape. Most of the times, information from these design features are not useful for downstream applications like manufacturing, costing, manufacturability analysis, etc. In such cases, either manual or automatic reinterpretation of 3D model data into application specific features is required. On the other hand, 3D models imported from other CAD systems do not have feature tree and they simply load as imported solids. In such cases, application specific features are to be extracted manually or automatically. Automatic extraction of features from 3D model can largely help in improving productivity during CAM process and other downstream processes.

SUMMARY

In at least one embodiment, a computer-implemented product includes instructions embodied in a non-transitory computer read-able medium that, when executed by a processor, cause the processor to recognize various bevel features from a three-dimensional (3D) sheet metal or 3D solid model. The processor when executing the instructions may receive a 3D model of a part and recognize a bevel feature via a bevel feature recognition module. The bevel feature recognition module may be configured to recognize bevel features and different types of vertex bevels based on the 3D model. For example, the bevel feature recognition module may recognize bevel features like straight cut, V-bevel, Inverted V-bevel, X-bevel, Y-bevel, Inverted Y-bevel, K-bevel, generic bevel features, and different types of vertex bevels like V-vertex bevel, Inverted V-vertex bevel, X-vertex bevel, Y-vertex bevel, Inverted Y-vertex bevel, and K-vertex bevel. The processor when executing the instructions may recognize a type of connected bevels via a bevel chain recognition module. The bevel chain recognition module may classify the connected bevels as tangential bevel chains, non-tangential bevel chains and mixed bevel chains. The processor when executing the instructions may generate bevel profiles, via a bevel profile creation module, for various bevel chains, single bevels and vertex bevels.

In at least one embodiment, a method to recognize various types of bevel features from 3D boundary representation sheet metal models or solid models is provided. The method may recognize bevel features and vertex bevels and generate a bevel feature chain and a bevel profile creation. The method may recognize the set of faces that constitute a feature. The method may, via the bevel feature recognition module, process the 3D model data in a B-rep format as input from which geometry and topology data of the 3D model are used to recognize various features. The method may recognize a sheet thickness, top skin, bottom skin and other faces based on the three-dimensional model. The method may segregate, via the bevel feature recognition module, other faces into multiple levels of faces connected between the top skin and bottom skin. The method may determine a height, width and angle for each level. The method may recognize one or more bevel features based on the determined height, width and angle. The method may recognize end types of bevels, via the bevel chain recognition module, and classify them into tangential, non-tangential, dissimilar and isolated ends based on connectivity. The method may recognize single bevels and bevel chains based on the recognized bevel features and bevel end types. The method may classify bevel chains, via the bevel chain recognition module, as tangential, non-tangential and mixed bevel chains. The method may create, via the bevel profile module, a bevel profile used for recreation of bevels or cutter path generation for manufacturing, costing, etc., for all bevel chains, single bevels and vertex bevels.

In at least one embodiment, a computer-implemented product including instructions embodied in a non-transitory computer read-able medium that, when executed by a processor, cause the processor to recognize a bevel feature from a boundary representation model of a part is provided. The processor when executing the instructions identifies a boundary loop associated with the top skin and defines a perimeter of a topological feature containing a first level face based on input indicative of the top skin, bottom skin, and other face of the boundary representation model. The processor when executing the instructions may identify a coedge of the first level face opposite the top skin based on the boundary loop being convex. The processor when executing the instructions may quantify a number of levels between the top skin and the bottom skin of the boundary representation model based on whether the coedge is the bottom skin. The processor when executing the instructions may tag the first level face as belonging to a straight cut, v-bevel, k-bevel, x-bevel, y-bevel, inverted y-bevel, or inverted v-bevel based on the number and geometric properties of the levels.

In at least one embodiment, a computer-aided design tool for receiving a boundary representation model of a part and recognizing one or more bevels based a number of levels between a top skin and bottom skin of the part and geometric properties of the levels. The tool may comprise one or more processors programmed to identify a boundary loop associated with the top skin, bottom skin and other face defining a perimeter of a topological feature of the part. The one or more processors may be further programmed to identify a first level face based on input selecting the top skin of the boundary representation model of the part. The one or more processors may be further programmed to identify a coedge of the first level face opposite to the top skin based on the boundary loop being convex. The one or more processor may be further programmed to quantify the number of levels between the top skin and a bottom skin of the boundary representation model based on whether the coedge is the bottom skin. The one or more processor may be further programmed to tag the first level face as belonging to a straight cut, v-bevel, k-bevel, x-bevel, y-bevel, inverted y-bevel, or inverted v-bevel based on the number and geometric properties of the levels.

BRIEF DESCRIPTION OF THE DRAWINGS

FIG. 1B is a block diagram illustrating a three-dimensional view of a solid model that contains multiple bevel shapes;

FIG. 2 is a block diagram illustrating a three-dimensional view of a solid model that comprises bevel chains;

FIG. 3 is a flow chart of a bevel recognition method;

DETAILED DESCRIPTION

Figure 1A:
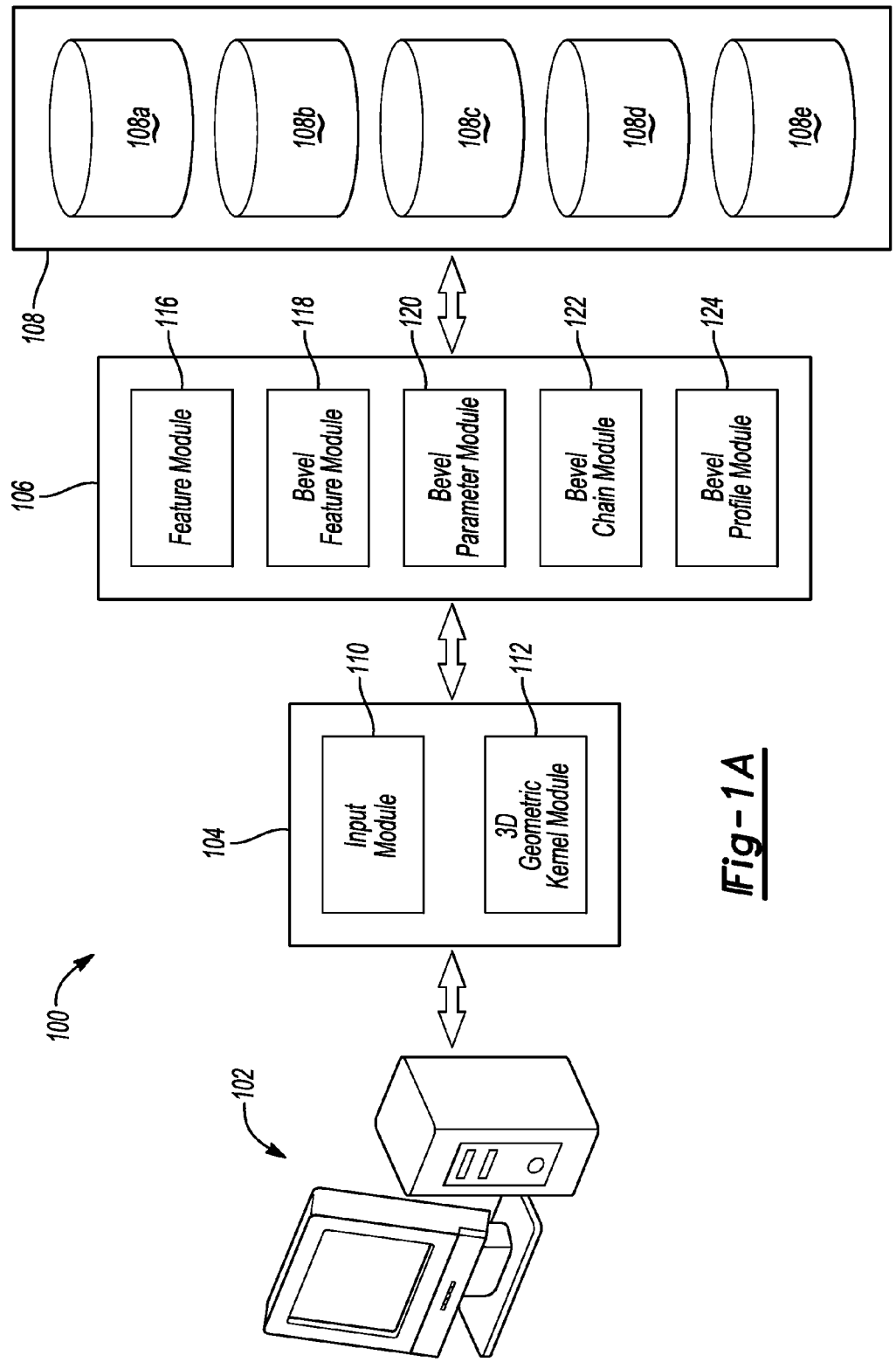
FIG. 1A is an exemplary block topology of a feature recognition system.

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the embodiments. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

The embodiments of the present disclosure generally provide for a plurality of circuits or other electrical devices. All references to the circuits and other electrical devices and the functionality provided by each, are not intended to be limited to encompassing only what is illustrated and described herein. While particular labels may be assigned to the various circuits or other electrical devices disclosed, such labels are not intended to limit the scope of operation for the circuits and the other electrical devices. Such circuits and other electrical devices may be combined with each other and/or separated in any manner based on the particular type of electrical implementation that is desired. It is recognized that any circuit or other electrical device disclosed herein may include any number of microprocessors, integrated circuits, memory devices (e.g., FLASH, random access memory (RAM), read only memory (ROM), electrically programmable read only memory (EPROM), electrically erasable programmable read only memory (EEPROM), or other suitable variants thereof) and software which co-act with one another to perform operation(s) disclosed herein. In addition, any one or more of the electric devices may be configured to execute a computer-program that is embodied in a non-transitory computer readable medium that is programmed to perform any number of the functions as disclosed.

The disclosure proposes systems and methods to recognize various types of bevel features from a boundary representation model. The boundary representation (B-rep) model may represent three-dimensional (3D) model data by bounding surfaces. The B-rep model may include a sheet metal model or a solid model. The B-Rep contains model information in the form of solids, faces, edges and vertices. A solid may include a bounded volume of multiple faces. Face data may include surfaces like planar, cylindrical, spherical, toroidal, conical, spline surfaces, etc. Faces may contain bounding loops formed by edges like lines, circles, arcs, splines, etc. Faces may comprise several bounding loops, an outer loop that represents outer boundary of a surface and inner loops that represent holes in the face. The disclosure proposes systems and methods that recognize various types of bevel features in the B-Rep that may include, but is not limited to, a straight cut, a V-bevel, an inverted V-bevel, a Y-bevel, an inverted V-bevel, an X-bevel, a K-bevel, a generic bevel, and various vertex bevels.

The disclosure proposes systems and methods that may also generate a bevel feature chain and a bevel profile creation. The bevel feature chain may include, but not limited to, a non-tangential bevel chain, a tangential bevel chain, and a mixed bevel chain. The bevel profile creation may generate parameters for creating manufacturing tool paths using data from a recognized bevel and bevel feature chain or for recreation of bevel features from imported solids. The systems and methods may recognize the bevel feature chain and generate bevel profile based on recognizing the set of faces that constitute a feature and extracting few feature parameters depending on the feature type.

The disclosure may include software modules (i.e., algorithms) which operate on solid models and are executed on a local computer, a computer communicating in a network, a computer communicating with a server, and/or a combination thereof. The modules may be implemented in any programming language including, but not limited to, C++, C#, and may use local operators from known geometric modeling kernels (e.g., Parasolid, ACIS, CGM, Granite, OpenCascade, etc.) or any modeler (e.g., SolidWorks, CATIA, etc.).

FIG. 1 is an exemplary block topology of a feature recognition system. The feature recognition system 100 may have hardware architecture for executing a feature recognition software used for product development and manufacturing. The software system 100 may be web-based and/or executed on hardware of a local computer. The software system 100 may include product development methods that integrate one or more computer-aided designs (CAD) and/or computer-aided manufacturing (CAM) models. The system may include, but is not limited to, a computer 102, initial processing algorithms 104, feature recognition algorithms 106, and a database 108. The one or more algorithms may be executed on hardware at the computer 102 and/or at a remote server in communication with the computer 102. The system 100 may be a tool operated for analysis of one or more models.

For example, the system 100 architecture may be a web-based software working over an internet and/or intranet allowing worldwide access to one or more facilities across the globe. The primary requirement of the computer 102 is that it has access to the feature recognition software (library executable file or dll). The software may reside at a host location which is located on a customer server with access to a server manager and any computer 102 that has a browser with access to the internet and/or intranet. The system 100 architecture may allow a user to create an enterprise specific knowledge database bank 108 allowing for feature recognition analysis to cross reference a technical specification, a specific customer requirement, and/or other product manufacturing requirements.

The database bank 108 may include several databases to store data input, technical requirements and specifications, and feature recognition algorithms. For example, the database bank 108 may include, but is not limited to, a feature database 108a, a bevel database 108b, a bevel parameters database 108c, a bevel chain database 108d and a bevel profile database 108e. The database bank 108 may store the feature recognition algorithms so that the system 100 may update the feature recognition software based on software updates, user input, and/or historical data generated during execution of the one or more algorithms.

The system 100 architecture network may include, but is not limited to, a server (not shown), one or more processors (not shown), one or more computer systems (e.g., computer 102), and software executed on the computer 102 hardware. The system 100 may be designed as a standalone system. The one or more computer systems 102 may be located at an individual user site having a single office, or several offices globally located.

In one embodiment, the system 100 architecture may include, but is not limited to, a webserver (not shown), a database 108, feature recognition algorithms 106, initial processing algorithms 104, and one or more computer systems 102. The webserver may comprise a processor, RAM, a hard disk drive, and the necessary server software. The database 108 may include, but is not limited to, a relational database management system (e.g. Microsoft SQL server) having a processor, RAM, a hard disk, and an operating system software. The one or more computer systems 102 comprise at least one processor, RAM, browser, and internet/intranet software requirements.

The initial processing algorithms may be located at the computer 102 and comprise an input module 110, a three dimensional geometric kernel module 112, and/or a knowledge management module (not shown). The input module 110 may receive one or more B-rep models and relevant inputs. The three dimensional geometric kernel module 112 may process the input data format and provide application programming interfaces for geometry inquiry at the computer 102. The knowledge management module may manage the one or more modules and software algorithms in communication with each other to execute the feature recognition system.

The feature recognition software 106 may be a standalone design using only a database system as the backend database manager. The feature recognition algorithms may include, but are not limited to, a feature module 116, a bevel feature module 118, a bevel parameters module 120, and/or a bevel chain module 122 and a bevel profile module 124. The feature module 116 may identify a feature of the part. The bevel feature module 118 may identify a bevel on the part. The bevel parameters module 120 may identify parameters based on the bevel. The bevel chain module 122 may identify one or more connected bevel features of the part. The bevel profile module 124 may identify bevel profiles of all single bevels and bevel chains.

The feature recognition software 106 may include application programming interfaces allowing software components to interact with other product development, design, and manufacturing applications. The system 100 executing the feature recognition software 106 may communicate with other software via a set of rules for encoding models in a format that is both human-readable and machine-readable. The software may include, but is not limited to, using and/or creating product and manufacturing models based on product and process requirements, manufacturing requirements, detective controls, control (test and detection activities) implementation design details, product details related to FMEAs, problem details related to global 8D method, and final solution and validation design requirements.

For example, the recognition software-based system 100 and method of this disclosure may have the input module 104 receive the B-rep from, for example, one of a solid modeling program (e.g., SolidWorks) or any other source capable of providing a standardized data structure for describing solids.

A product development cycle may depend on computer aided design and manufacturing such that the product data is represented as three-dimensional models and/or in two-dimensional orthographic representations. Automation of downstream activities may require relevant information to be retrieved from the three-dimensional model. Generally, such information is manually retrieved and fed for processing. Manual methods may affect productivity and largely rely on individual's capability and judgment, which may not be consistent. The system 100 may provide an automated way of extracting such information and assist in automation and improve productivity. Hence, an automatic method for extraction of such information from a three-dimensional model through features is disclosed and discussed in more detail below.

For example, the three-dimensional model may be generally stored as the B-rep model that serves as a data model. The data model may provide the three-dimensional model data as a whole. The shapes of local regions within the three-dimensional model may contain information relevant to design, manufacturing, costing, etc. Feature recognition algorithms such as 106 may be designed to identify these local regions. Depending on the type of information content in the one or more features, they may be classified into various feature types like functional features, form features, design features, manufacturing features, assembly features, tolerance features, inspection features, etc. Many definitions for the term "feature" have been proposed in the literature. A feature represents the engineering meaning or significance of the geometry of a part or assembly as disclosed in Shah, J. J., *Features in Design and Manufacturing, in: Intelligent Design and Manufacturing*, A. Kusiak (ed.), John Wiley & Sons, 1992, and in Shah, J. J. and M. Mantyla, *Parametric and Feature-based CAD/CAM*, John Wiley & Sons: New York, N.Y. 1995. It is generally agreed that features may have attributes that have to do with geometry of the part and attributes that deal with the function they serve in the part as disclosed in Kannan, T. R., *An Integrated Planner for Manufacture of Sheet Metal Components Using STEP AP-203*, Ph.D. Thesis, India Institute of Technology Madras, Chennai, 2007.

The three-dimensional modelers like SolidWorks, Inventor, Pro/E, CATIA, NX, etc., may use some sort of feature based modeling techniques, in which the three-dimensional model may be created by means of features, which adds or subtracts volumes. A feature tree may be listed for a three-dimensional model which stores the historical feature data of a model and is generally accessible through suitable application programming interfaces. Though these models may be feature based, the feature information in these models may not be useful for downstream automation as the features are more of design features and may not provide sufficient information for manufacturing, processing, or costing, etc.

For example, a bevel in a part may be manufactured only when the feature information is listed as a bevel and includes bevel parameters like bevel type, faces associated with the bevel feature, thickness, number of level of faces, height of each level of faces, etc. Bevels may be created in these three-dimensional modelers using multiple methods like an extrude with taper or an extrude with appropriate sketch or by chamfering faces or edges or vertices in which the respective features in the feature tree may be listed as an extrude or extruded-cut or a chamfer. Bevels may also be created using a combination of these features. For manufacturing, the feature should be identified as a bevel feature irrespective of the design method used. With design feature tree information, it may not be possible to identify the type of bevel, as all extruded cuts or extrudes cannot be bevels and all chamfers cannot be bevels. Similarly for any model, irrespective of design features used to create the three-dimensional model, features have to be reinterpreted in the form of domain-specific features to facilitate various downstream automation processes.

It may also be possible that a three-dimensional model created in any CAD modeler may need to be processed in another CAM system where the CAD and CAM systems are not from the same vendor. To address such cases, most of the CAD/CAM systems may provide options for importing three-dimensional model(s) made from third party software. After importing, however, the three-dimensional model may list only as an imported solid in the feature tree without any feature information. The systems and methods for feature recognition including bevel feature recognition, bevel chain recognition, bevel parameters creation and bevel profile creation may provide feature information as disclosed and discussed in further detail below.

Figure 15A:
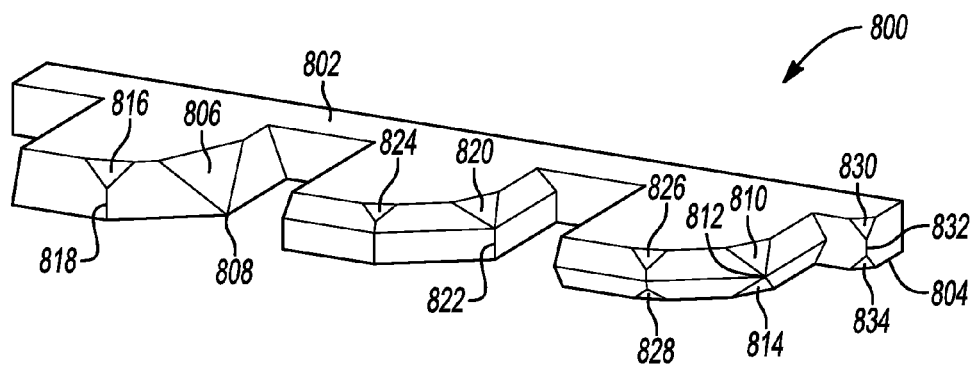
FIG. 15A-15B are illustrative examples of a three-dimensional view of a solid model having vertex bevels.

FIG. 1B is an illustrative example of different bevel features. The different bevel features may include a straight cut 150, a V-bevel 152, an inverted V-bevel 154, a Y-bevel 156, an inverted Y-bevel 158, an X-bevel 160, a K-bevel 162, various generic bevel features 164, and various vertex bevels (as shown in FIG. 15A and discussed in further detail below). An inclined surface with respect to a base of a part or an adjacent face may be recognized as a bevel. Depending on shape and position of inclined surfaces, different bevel configurations may be created as shown in FIG. 1B. The first six bevel features illustrated from left to right may be manufactured with through-cutting machines such as laser, waterjet, plasma, flame cutting machines, as well as milling, and electro discharge machining, etc. Other bevel configurations may require milling or other machining operations. The bevels shown in FIG. 1B are single bevels that are not attached at the ends to other bevels.

FIG. 2 is a block diagram illustrating a three-dimensional view of a solid model that comprises bevel chains. The combination of two or more bevels adjacent to each other may form a bevel chain. A bevel chain may be classified into several types including tangential bevel chain, non-tangential bevel chain, and a mixed bevel chain. In tangential bevel chains, all adjacent bevels are connected tangential to each other. In non-tangential bevel chains, all adjacent bevels are connected non-tangential to each other. A mixed bevel chain may include a mix of tangential connectivity and non-tangential connectivity between adjacent bevels.

For example, the bevel feature chains illustrated in FIG. 2 include a non-tangential Y-bevel chain 202, a tangential V-bevel chain 204, and a mixed Y-bevel chain 206. The mixed Y-bevel chain 206 includes three straight Y-bevels 206a, 206c, 206d and a circular Y-bevel 206b. The connectivity between bevels 206a and 206b as well as 206b and 206c are tangential. Whereas the connectivity between bevels 206c and 206d is non-tangential.

As shown in FIG. 2, bevel chains may be either in inner bounding loops such as the non-tangential Y-bevel chain 202 or outer bounding loops such as the mixed Y-bevel chain 206. It should be noted that bevel chains need not cover all edges of a bounding loop and may cover only few edges of a bounding loop as that of mixed Y-bevel chain 206.

The bevel feature chain information may provide information such as the order of bevel features to be machined. The bevel feature chain information may provide the system to determine if the bevels are connected to each other in such a way that may influence a machining strategy of each feature while providing an enhanced manufacturing process of the part.

FIG. 3 is a flow chart of a bevel recognition method. The method 300 may be implemented using software code contained within the bevel feature recognition executable. In other embodiments, the method 300 may be implemented on a controller (processor), implemented at a server in communication with the controller, and/or a combination thereof.

Referring again to FIG. 3, the bevel recognition method and its components illustrated in FIG. 1A are referenced throughout the discussion of the methods to facilitate an understanding of various aspects of the present disclosure. The method 300 of recognizing a bevel feature in a solid model while communicating with one or more design and manufacturing computer-aided tools may be implemented through a computer algorithm, machine executable code, or software instructions programmed into a suitable programmable logic device(s) of the controller, such as the controller of a computer, the one or more controllers at a server, or a combination thereof. Although the various operations shown in the flowchart diagram 300 appear to occur in a chronological sequence, at least some of the operations may occur in a different order, and some operations may be performed concurrently or not at all.

In operation 302, the one or more processors may be initialized to begin execution of the bevel recognition method. For example, a CAD and/or CAM application may initialize the bevel recognition method by calling a library containing the bevel recognition tool. In other embodiments the bevel recognition method may be embedded in several formats including, but not limited to, software executable, a library, a dynamic link library, and/or may be a part of an application as direct source code.

In operation 304, the bevel recognition software system and method may receive a three-dimensional sheet metal model or a solid model data in B-rep format as input. The sheet metal model and/or solid model may provide the method with geometry and topology data. The method may use the geometry and topology data to recognize various features in operation 306. For example, the method 300 may use the geometry and topology data to recognize thickness 405, top skin 402, bottom skin 404 and other faces 403 of the model shown in FIG. 4A.

Figure 4A:
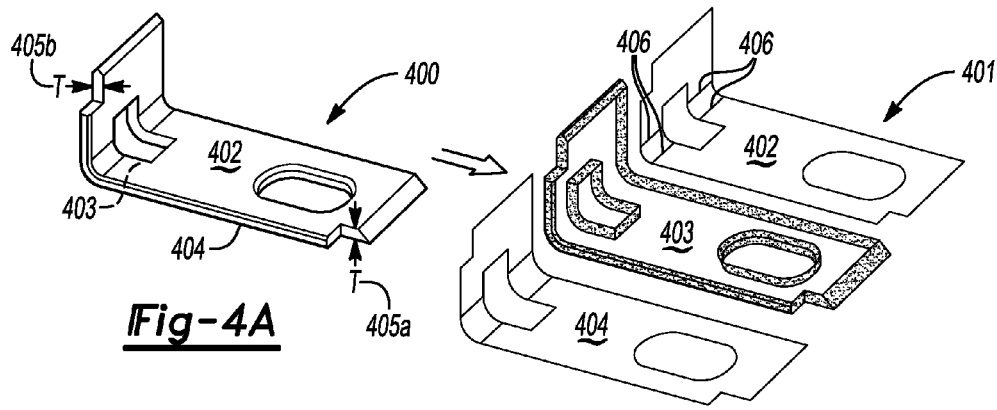
FIG. 4A is a three-dimensional views of a solid model having a top skin, bottom skin and other faces.
Figure 6:
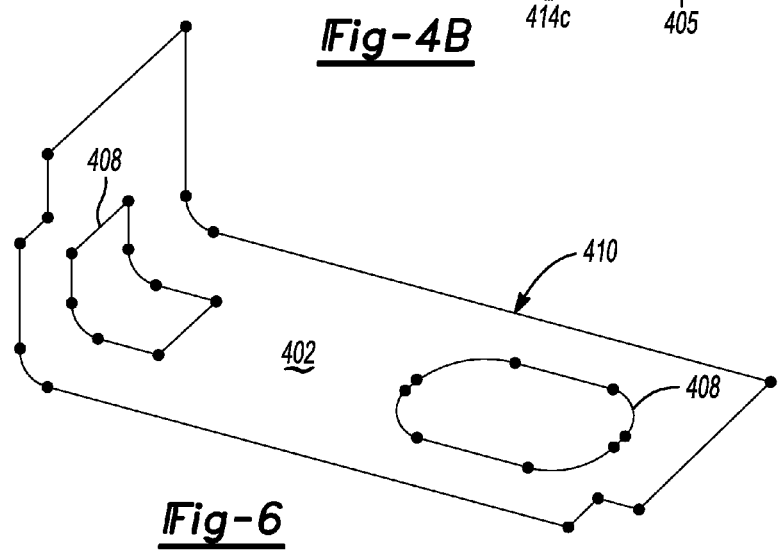
FIG. 6 illustrates a three-dimensional view of a block diagram having a top skin that contains outer bounding loops and inner bounding loops.

FIG. 4A is a three-dimensional view of a solid model 400 illustrating a top skin 402, bottom skin 404, other faces 403, and thickness 405. The solid model 400 is illustrated in an exploded view 401 to depict the top skin 402, other faces 403, and bottom skin 404. As shown in the exploded view 401, the method 300 may recognize shared edges 406 of the top skin 402. Based on the identification of shared edges 406, the method may remove the shared edges 406 of the top skin 402 when determining the outer bounding loop and inner bounding loop(s) as shown in FIG. 6.

In operation 308, the method may process the data using a bevel feature recognition module. The bevel feature recognition module may recognize one or more bevel features based on segregating other faces 403 as shown in FIG. 4A into multiple levels of faces connected between the top skin 402 and bottom skin 404. The method may recognize end types of all bevels. For example, the method may classify the end types as a tangential end, non-tangential end, dissimilar end, or isolated end.

In operation 310, the method may generate a bevel chain using a bevel chain recognition module based on the bevels and bevel end types. The method may recognize the bevel chain as a tangential, non-tangential, and mixed bevel chains. The method may generate bevel profiles for bevel chains, single bevels and vertex bevels in operation 312. Bevel profiles may be used for recreation of bevels by CAD application and/or for cutter path generation which may be used for planning manufacturing, costing, etc. for the model (e.g., part and/or product). For example, depending on the type of bevel and manufacturing process, either a single operation or multiple operations may be required to machine the bevel. The one or more bevels (e.g., K-bevel, X-bevel, Y-bevel, etc.) may include multiple levels of faces and each level of faces may require different tool paths for a cutting machine during the manufacturing process.

The bevel feature recognition method may transmit the output results from the one or more modules to a product and/or manufacturing analysis tool (e.g., CAD, CAM, etc.). The feature recognition method may be disabled based on a completed analysis, a request received by an analysis tool, and/or a request received by user input in operation 314.

Figure 4B:
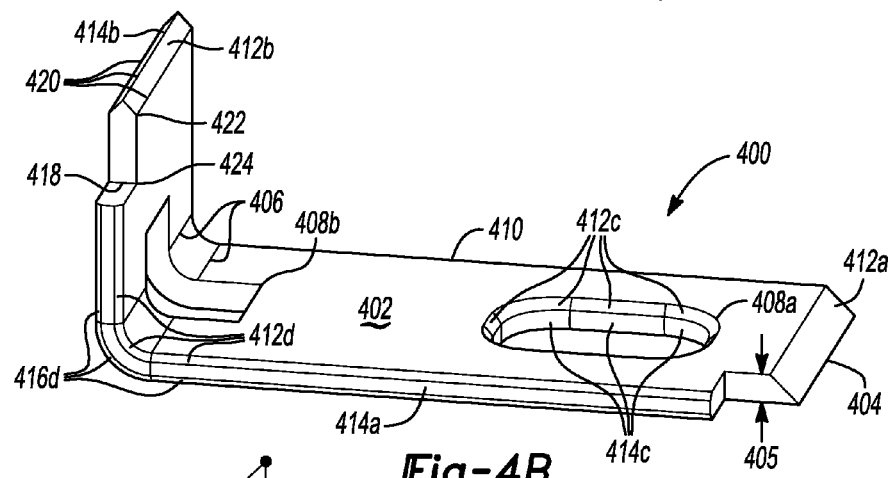
FIG. 4B is a three-dimensional view of a solid model depicting first level faces, second level faces and a third level faces of one or more bevel features.

FIG. 4B is a three-dimensional illustration of a solid model 400 from which a top skin 402, a bottom skin 404, and other faces (all remaining faces) are recognized. Based on the method identifying the other faces, first level faces 412, second level faces 414, and third level faces 416 of one or more bevel features are recognized. The method identifies the top face 402 comprising an outer bounding loop 410 and one or more inner bounding loops 408. The other faces may have a convex edge 420, a concave edge 418, convex end 422, and/or a concave end 424.

Figure 5A:
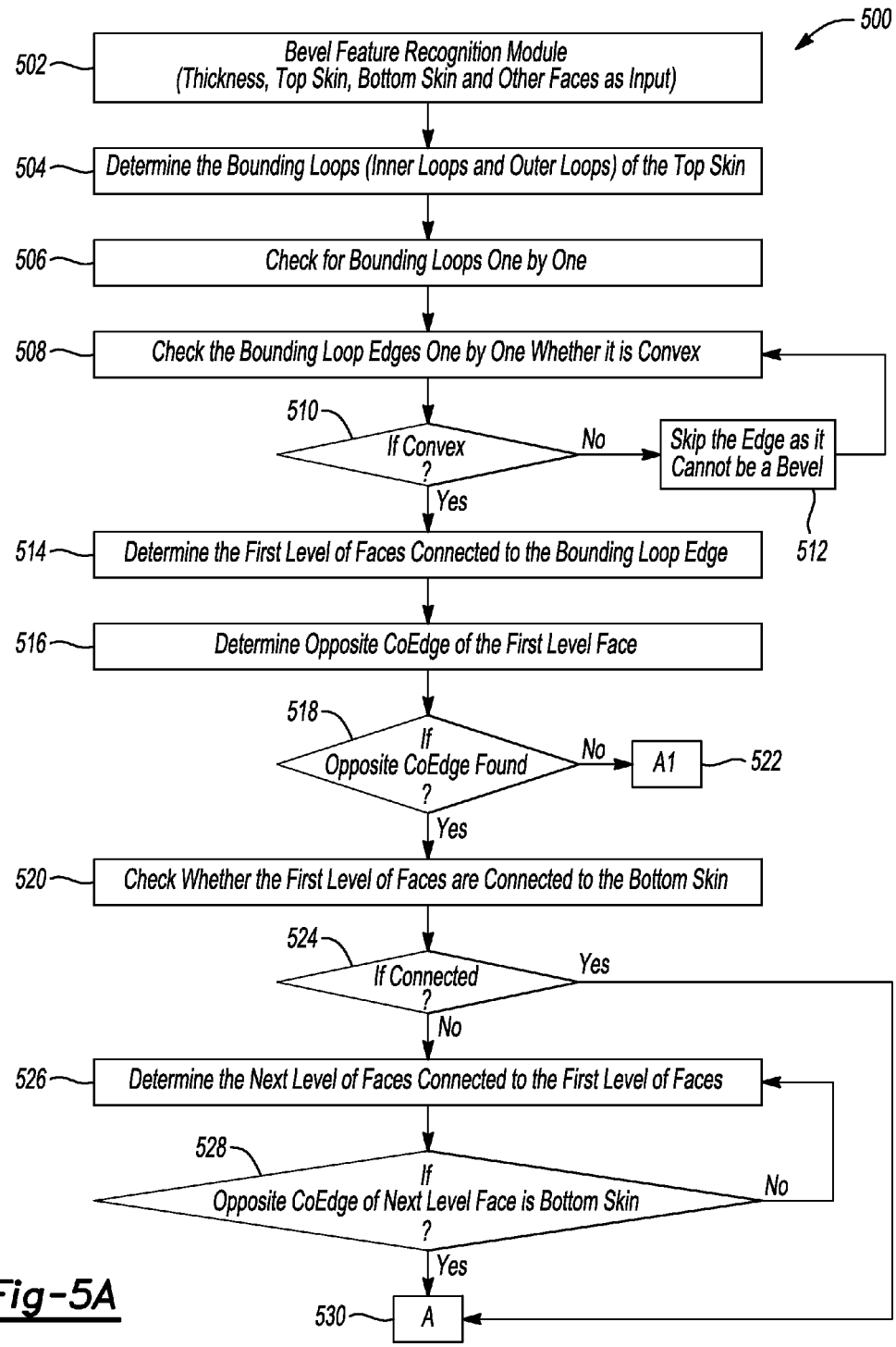
FIG. 5A is a flow chart of bevel feature recognition method.

FIG. 5A is a flow chart of bevel feature recognition module according to an embodiment. The method 500 may be implemented using software code contained within the bevel feature recognition executable. The method 500 may recognize a bevel feature in a solid model using one or more controllers executing a computer algorithm, machine executable code, or software instructions programmed into a suitable programmable logic device(s) of the controller, such as the controller of a computer, the one or more controllers at a server, or a combination thereof. Although the various operations shown in the flowchart diagram 500 appear to occur in a chronological sequence, at least some of the operations may occur in a different order, and some operations may be performed concurrently or not at all.

The one or more processors may be initialized to begin execution of the bevel feature recognition method. For example, a CAD and/or CAM application may initialize the bevel feature recognition method by calling a library containing the feature recognition tool. In other embodiments the bevel recognition method may be embedded in several formats including, but not limited to, software executable, a library, a dynamic link library, and/or may be a part of an application as direct source code.

In operation 502, the bevel feature recognition method may receive input from any solid model such as the solid model 400 shown in FIGS. 4A and 4B. The solid model 400 includes the top skin 402, a thickness 405, the bottom skin 404, and other faces 403 of the solid model 400. The method 500 may recognize one or more faces that constitute the top skin 402.

In operation 504, the method may recognize the bounding loops by processing the top skin. The method may process the one or more faces of the top skin 402 such that all edges shared by two faces may be recognized as shared edges 406 of the top skin 402 as shown in FIG. 4A. The method may remove the shared edges to get bounding loops as shown in FIG. 6. FIG. 6 illustrates a three-dimensional view of a block diagram having a top skin 402 that contains outer bounding loop 410 and inner bounding loops 408. The method may start processing the bounding loops one by one in operation 506.

In operation 508, the method may validate each bounding loop edge by checking whether it is convex (e.g., material angle less than 180 degrees). As illustrated in FIG. 4B, an example of a convex edge 420, a concave edge 418, a convex end 422 and a concave end 424 are shown.

In operation 510, the method may recognize if the bounding loop is convex. If the bounding loop edge is not convex, the method may skip the edge for processing as it cannot be a bevel in operation 512. The method 500 may continue to check the next bounding loop in operation 508.

Figure 7:
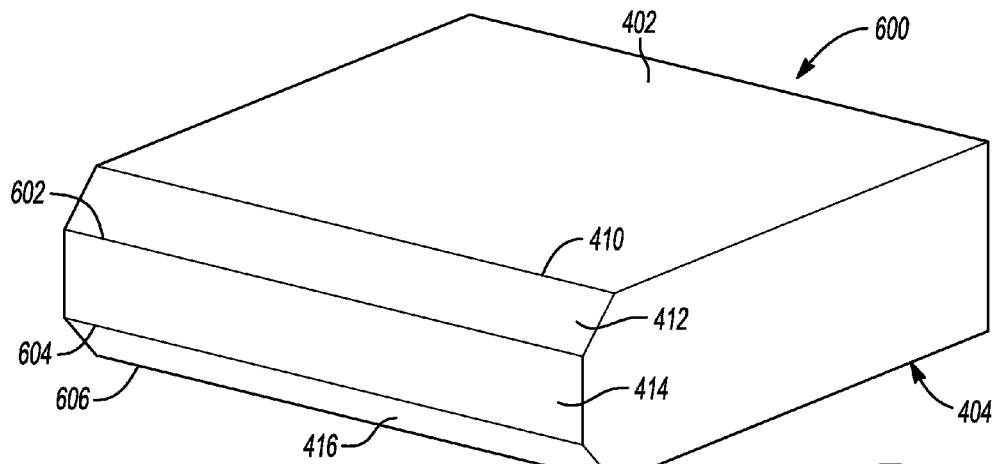
FIG. 7 is a three-dimensional view of a solid model that shows bevel edges between multiple levels of faces.

In operation 514, if the bounding loop edge is convex, the face that is directly attached to the bounding loop edge is collected and tagged as a first level face 412 as shown in FIG. 4B. The method 500 may determine an opposite coedge of the first level face in operation 516. The opposite coedge is the nearest edge of the first level face 412 that is not directly connected to the bounding loop edge. For example, FIG. 7 illustrates an example of the solid model 600 comprising a first opposite edge 602 of the first level face 412, a second opposite edge 604 of a second level face 414, and a third opposite edge 606 of a third level face 416.

In operation 518, the method may recognize if a coedge is found for the first level face 412. If the opposite coedge is found, the method checks whether the first level face is directly attached to the bottom skin 404, in operation 520. If the opposite coedge is not found, the method may identify the first level face feature as a vertex bevel. The method may process the vertex bevel using the vertex bevel recognition method in operation 522. The vertex bevel recognition method is further explained in FIGS. 16A and 16B.

In operation 524, the method determines if the first level face 412 is attached to the bottom skin 404. If the first level face 412 is attached to the bottom skin, then the method may process the next bounding loop edge in the top skin in operation 530.

If the first level face 412 is not attached to the bottom skin 404 the method determines the next level face attached to the first level face 412 in operation 526. The method may continue this process until each face in any level is directly attached to the bottom skin 404 in operation 528. As stated above, FIG. 7 illustrates the method identifying the correct next level face and opposite edge. The opposite edge for the first level face 412 is the nearest edge of the first level face 412 that is not directly connected to bounding loop edge. The face connected to the opposite edge of the first level face 412 is the second level face 414. Similarly, the opposite edge for the second level face 414 is the nearest edge of the face that is not directly connected to the first level face. The face connected to the opposite edge for the second level face 414 is the third level face 416. The third level face 416 is connected to the bottom skin 404. Thus, the method 500 may recognize multiple levels of faces attached between a bounding loop edge and the bottom skin 404 which are determined and tagged. The method continues this process for all bounding loop edges in all bounding loops.

Figure 5B:
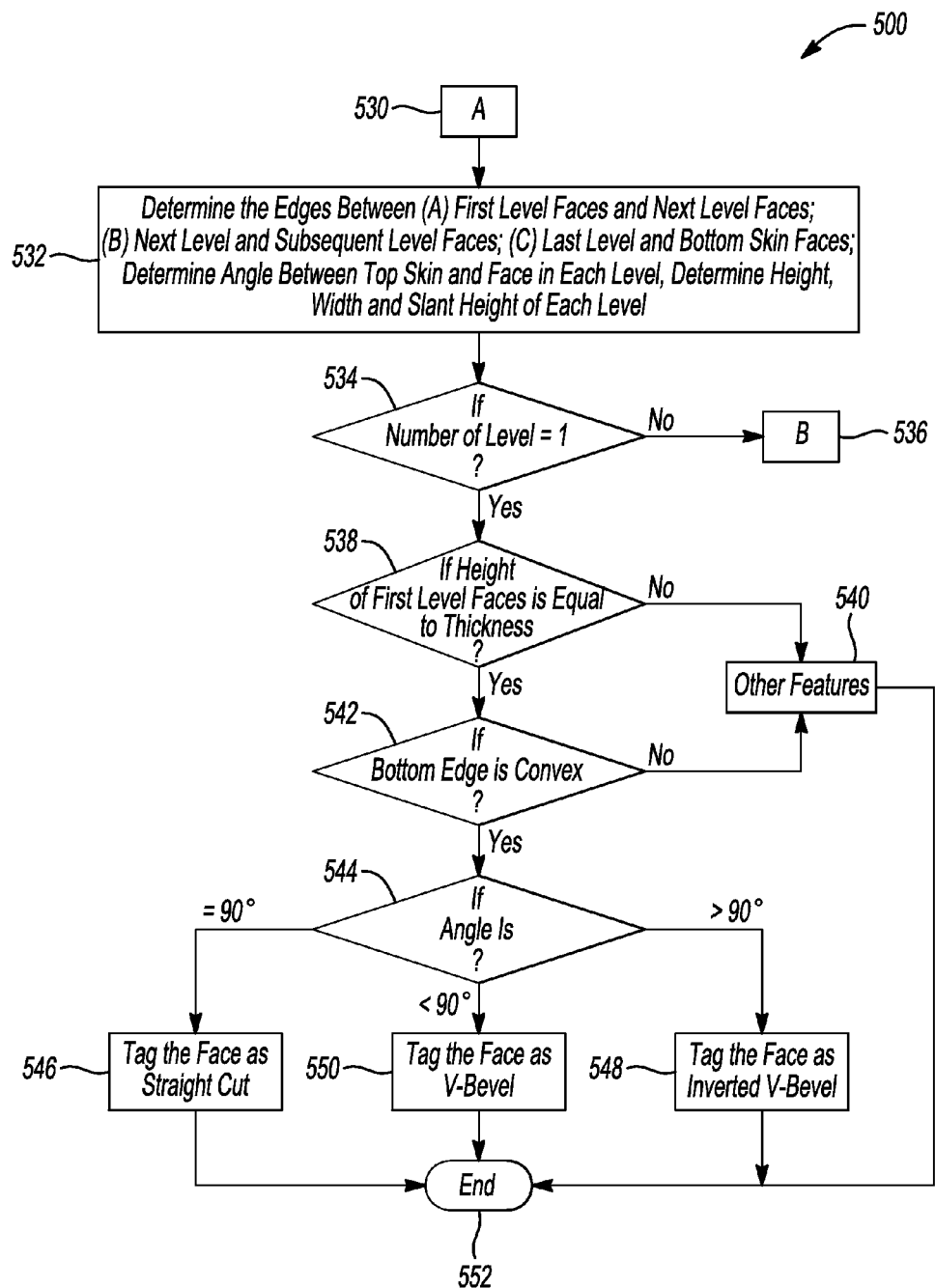
FIG. 5B is flow chart continuation of the bevel feature recognition method.

FIG. 5B is flow chart continuation of the bevel feature recognition method. The method may continue to analyze the solid model to determine the edges between the first level faces and the next level faces until the bottom skin is connected in operation 532. The method may determine opposite edges that may be edges between any two levels or an edge between a last level face and the bottom skin 404. The bounding loop edges or top edges, opposite edges and bottom edges are referred to as bevel edges.

Figure 8:
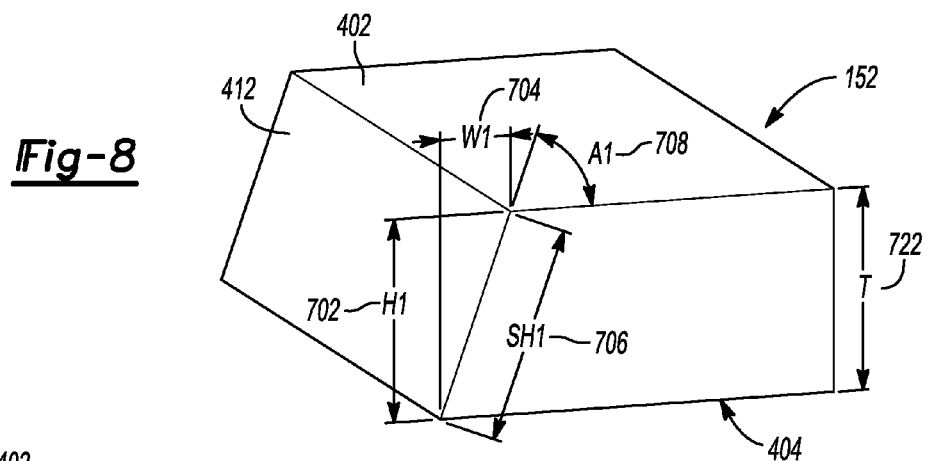
FIG. 8 is a three-dimensional view of a solid model that shows various bevel parameters of a V-bevel.

In operation 532, the method may determine height, width, slant height of each level and angle between the top skin and face in each level. For example, FIG. 8 is a three-dimensional view of a solid model that shows various bevel parameters of a V-bevel. As shown in FIG. 8, the method may calculate for each level a height (H1) 702, a width (W1) 704, a slant height (SH1) 706, a thickness (T) 722, and an angle (A1) 708 between the top skin 402 and for each level face(s). The method may also calculate the convexity of a bevel edge for various bevel features.

The method may also recognize bounding loop edges that may be linear or circular or splines and the bevels connected to these edges vary accordingly. Along with each bevel, the method may recognize and store the bounding loop edge type as feature data.

The method may identify the bevel features based on the number of levels, convexity of bevel edges and total height of all levels. For example, the method may recognize the number of level(s) in the bevel in operation 534. If the level is greater than one, the method may process the multiple levels of faces in operation 536.

In operation 538, if the number of levels is equal to one, the method may determine if the height (H1) 702 of first level face is equal to thickness (T) 722. If the height 702 of the first level face is not equal to the thickness 722, the method may recognize the face as other feature (e.g., not a bevel) in operation 540.

In operation 542, if the number of levels is equal to one and the height 702 of the first level face is equal to the thickness 722, the method may determine if the bottom edge is convex. If the method does not recognize the bottom edge as convex, the first level face may be classified as other feature (e.g., not a bevel) in operation 540. If the bottom edge of the first level face is convex, the method may determine whether the first level face is a straight cut or bevel feature depending on the angle 708 between the top skin 402 and the first level face. An example of the angle (A1) 708 from the top skin 402 to the first level face 412 is shown in FIG. 8. FIG. 8 illustrates a three-dimensional view of a solid model that shows various bevel parameters of a V-bevel 152 feature.

Figure 9:
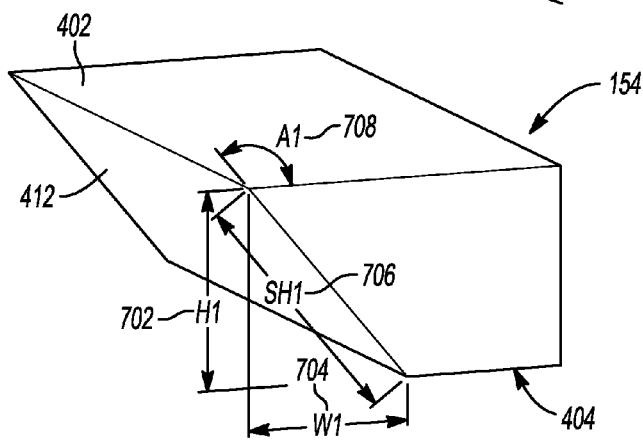
FIG. 9 is a three-dimensional view of a solid model that shows various bevel parameters of an inverted V-bevel.

In operation 544, the method may determine if the angle (A1) 708 between top skin 402 and the first level face 412 is less than ninety degrees as shown in FIG. 8. If the angle 708 is less than ninety degrees, then the method 500 may tag the first level face 412 as a V-bevel feature in operation 550. If angle 708 is greater than ninety degrees, the method 500 may tag the first level face 412 as inverted V-bevel feature in operation 548. FIG. 9 illustrates a three-dimensional view of a solid model that shows various bevel parameters of an inverted V-bevel 154 feature.

Figure 10:
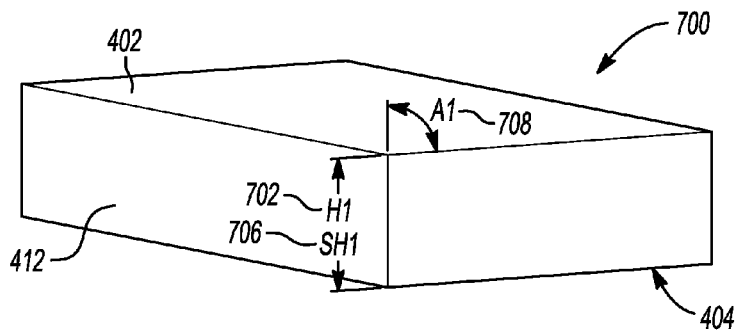
FIG. 10 is a three-dimensional view of a solid model that shows a straight cut feature.

In operation 546, if an angle 708 is equal to ninety degrees, the method may then tag the first level face 412 as a straight cut feature. FIG. 10 is an illustrative example of a three-dimensional view of a solid model that shows a straight cut 700 feature.

Figure 5C:
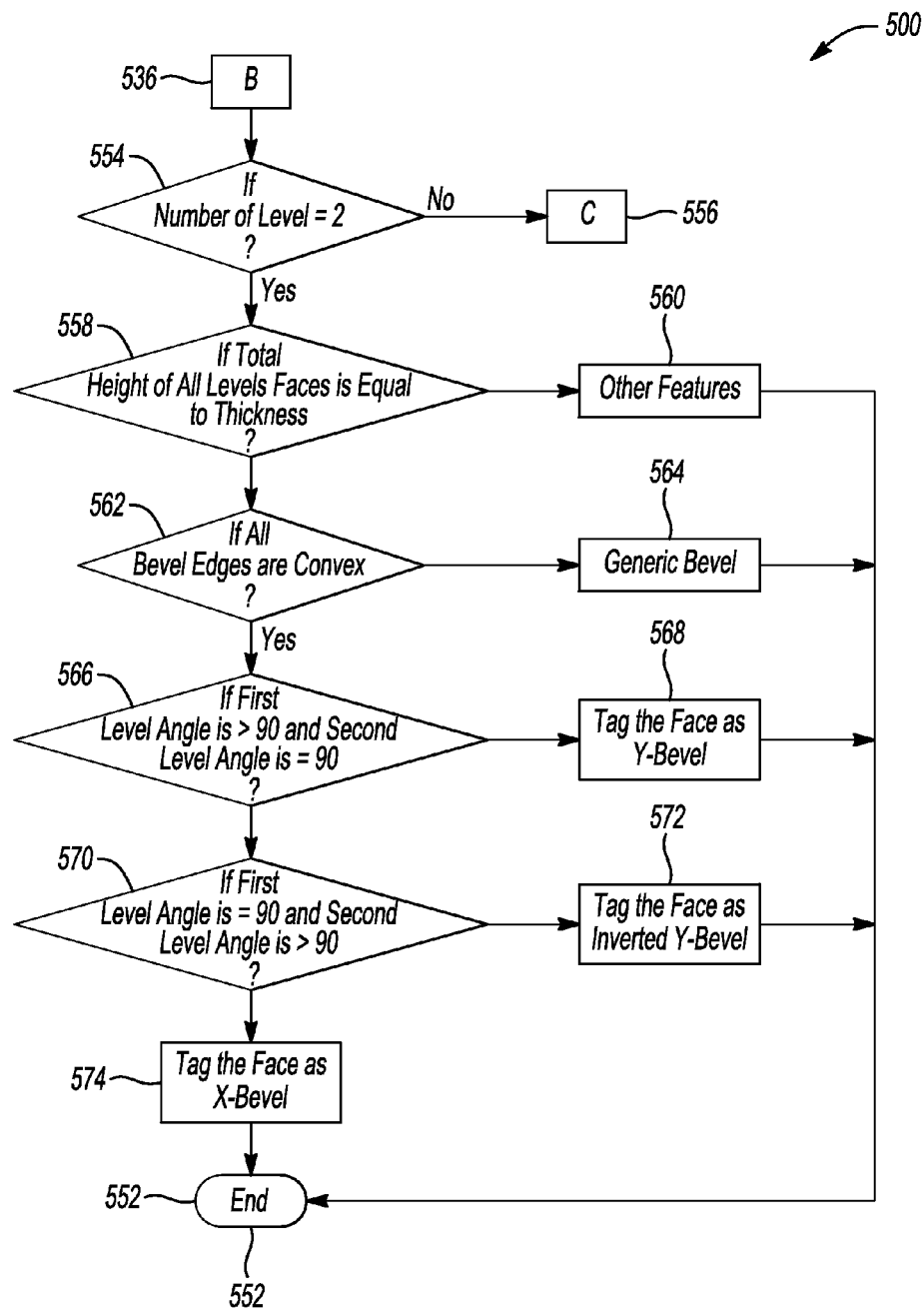
FIG. 5C is flow chart continuation of the bevel feature recognition method.

FIG. 5C is flow chart continuation of the bevel feature recognition method. The method recognizes the number of levels in the bevel in operation 554. If the method recognizes that the number of levels in the bevel is equal to two, the method may continue to determine the total height (H1+H2), which is the sum of height (H1) of first level face and the height (H2) of second level face and the method may determine if the total height is equal to thickness (T) in operation 558. If the height of the first level face and second level face are not equal to the thickness, the method may recognize the face as other feature (e.g., not a bevel) in operation 560. For example, if the number of levels is equal to two and the total height (e.g., H1+H2) of first level face and second level face is not equal to sheet thickness (T), the method may recognize that the faces may be other features and not a bevel.

In operation 562, once the method recognizes that the sum of the height of the first level face and second level face (i.e., H1+H2) are equal to the sheet thickness (T), the method then determines if all the bevel edges are convex. If the method finds at least one of the bevel edges is not convex, the first level face and second level face may be classified as a generic bevel in operation 564. If the bevel edges of the first level face and second level face are convex, the method may determine whether the first level angle is a less than ninety degrees and the second level angle is equal to ninety degrees in operation 566. If the first level angle is less than ninety degrees and the second level angle is equal to ninety degrees, the method may recognize the first level face and second level face as a Y-bevel in operation 568.

Figure 11:
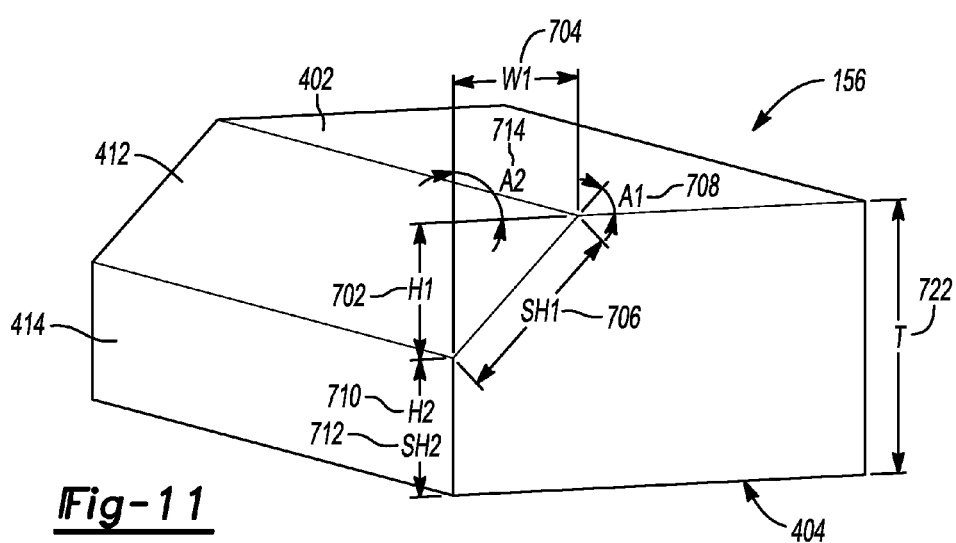
FIG. 11 is a three-dimensional view of a solid model that shows various bevel parameters of a Y-bevel.

For example, FIG. 11 is an illustrative example of a three-dimensional view of a solid model that shows various bevel parameters of a Y-bevel 156 feature. As shown in FIG. 11, the method may calculate for each level a height 702, 710, a width 704, a slant height 706, 712, a sheet thickness (T) 722 and an angle 708, 714. In response to the calculated variables, the method determines if the first level angle (A1) 708 is less than ninety degrees and the second level angle (A2) 714 is equal to ninety degrees, then the first and second level faces are tagged as Y-bevel feature as illustrated in FIG. 11.

In operation 570, if the bevel edges of the first level face and second level face are convex, the method may determine whether the first level angle is equal to ninety degrees and the second level angle is greater than ninety degrees. If the first level angle is equal to ninety degrees and the second level angle is greater than ninety degrees, the method may recognize the first level face and second level face as an inverted Y-bevel feature in operation 572.

Figure 12:
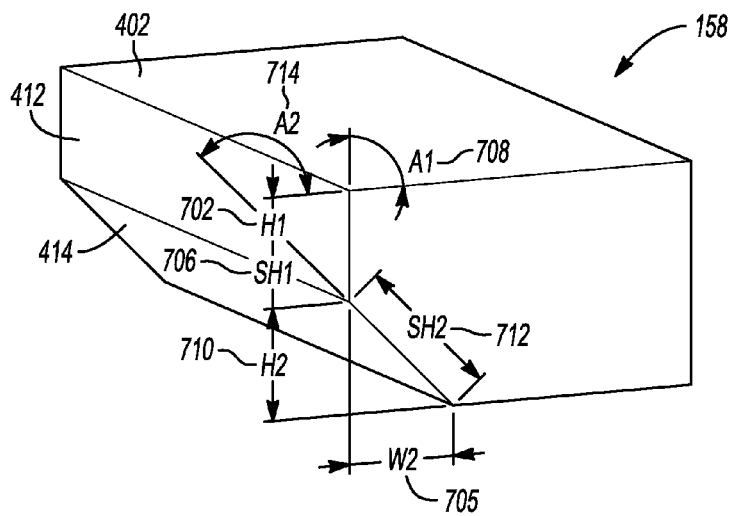
FIG. 12 is a three-dimensional view of a solid model that shows various bevel parameters of an inverted Y-bevel.

FIG. 12 is an illustrative example of a three-dimensional view of a solid model that shows various bevel parameters of an inverted Y-bevel 158 feature. As shown in FIG. 12, the method may calculate for each level a height 702, 710, a width 705, a slant height 706, 712, and an angle 708, 714. The method determines if first level angle (A1) 708 is equal to ninety degrees and second level angle (A2) 714 is greater than ninety degrees, then the first and second level faces are tagged as an inverted Y-bevel as shown in FIG. 12.

Figure 13:
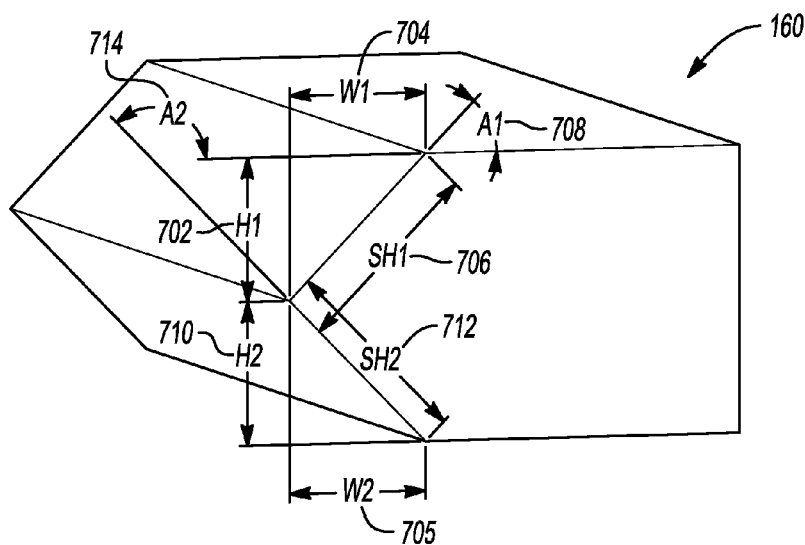
FIG. 13 is an illustrative example of a three-dimensional view of a solid model that shows various bevel parameters of an X-bevel feature.

In operation 574, if the first level angle is less than ninety degrees and the second level angle is greater than the first level angle and is not equal to ninety degrees, the method may tag the first and second level faces as an X-bevel feature. FIG. 13 is an illustrative example of a three-dimensional view of a solid model that shows various bevel parameters of an X-bevel 160 feature. As shown in FIG. 13, the method may calculate for each level a height 702, 710, a width 704, 705 a slant height 706, 712, and an angle 708, 714. In response to the calculated variable, the method determines if the first level angle (A1) is less than ninety degrees and the second level angle (A2) is greater than the first level angle (A1) and is not equal to ninety degrees, the method may tag the first and second level faces as an X-bevel feature as shown in FIG. 13.

Figure 5D:
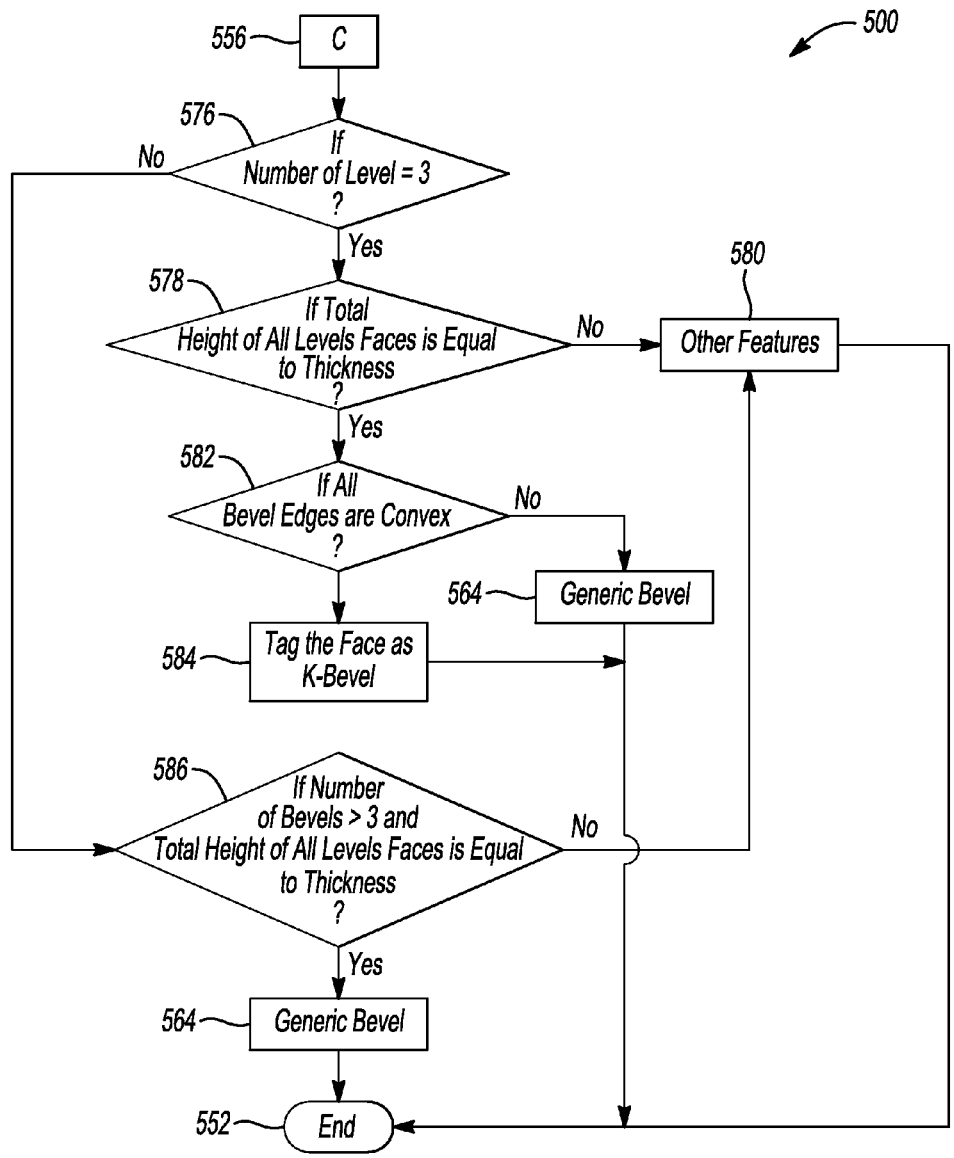
FIG. 5D is flow chart continuation of the bevel feature recognition method.

FIG. 5D is flow chart continuation of the bevel feature recognition method. The method may recognize that the number of levels is equal to three in operation 576. If the method recognizes that the number of levels is equal to three, the method may determine the total height of all the levels in operation 578.

The method may determine the total height (H1+H2+H3), which is the sum of height (H1) of first level face, the height (H2) of second level face, and the height (H3) of the third level face. If the total height is not equal to the thickness of the sheet, the method may recognize the first to third level faces as other feature (e.g., not a bevel) in operation 580. If the number of levels is three and the total height (i.e., H1+H2+H3) of the first level face through the third level face is equal to the sheet thickness (T) 722, the method may determine if all the bevel edges are convex in operation 582.

If the method finds at least one of the bevel edges is not convex, the first level face, the second level face, and the third level face may be classified as a generic bevel in operation 564. If the method recognizes the bevel edges of the first level face, the second level face, and the third level face are convex, the method may tag the faces as a K-bevel feature in operation 584.

Figure 14:
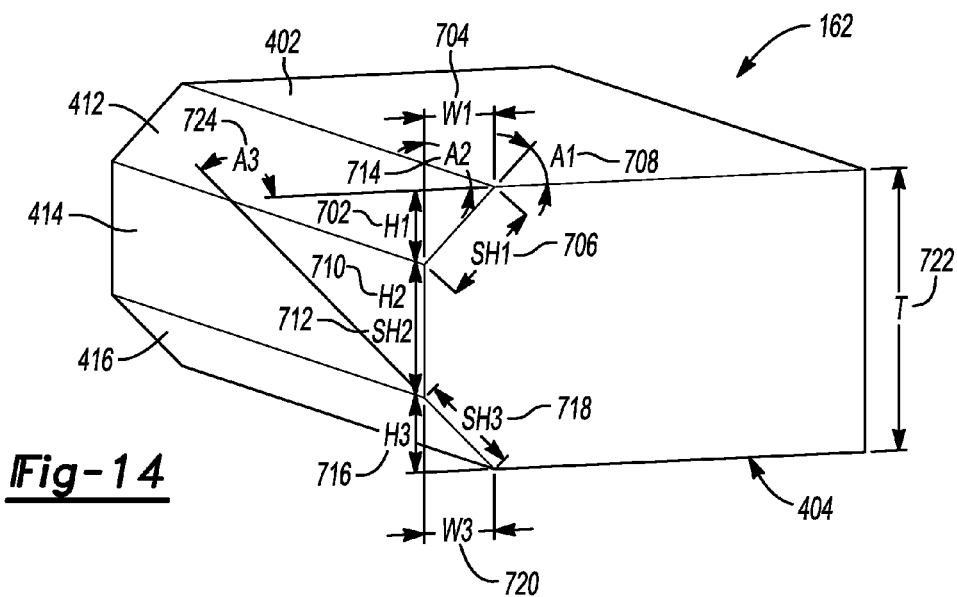
FIG. 14 is an illustrative example of a three-dimensional view of a solid model that shows various bevel parameters of a K-bevel feature.

FIG. 14 is an illustrative example of a three-dimensional view of a solid model that shows various bevel parameters of a K-bevel 162 feature. As shown in FIG. 14, the method may calculate for each level a height 702, 710, 716, a width 704, 720, a slant height 706, 712, 718, and an angle 708, 714, 724. The method determines the total height as the sum of heights of the first level face, the second level face, and the third level face (i.e., H1+H2+H3) and verifies whether the total height is equal to the sheet thickness (T) 722, the method determines if the first level angle (A1) 708 is less than ninety degrees, the second level angle (A2) 714 is equal to ninety degrees, and the third level angle (A3) 724 is greater than ninety degrees. The method may tag the first, second, and third level faces as a K-bevel feature based on A1 708 being less than ninety degrees, A2 714 being equal to ninety degrees and A3 724 being greater than ninety degrees as shown in FIG. 14.

In operation 586, if the number of levels is greater than three and the total height (i.e., H1+H2+H3+ . . . +Hn) of the first level face to the nth level face is not equal to the sheet thickness, the method may determine that the set of faces may be recognized as an "other feature" and not a bevel. If the number of levels is greater than three and the total height (i.e., H1+H2+H3+ . . . +Hn) of the first level face to the nth level face is equal to sheet thickness (T), the method may tag the first level to nth level faces as a generic bevel feature in operation 564. Once the method completes the recognition of the above mentioned bevels and other features in the solid model, it may end the process in operation 552.

Figure 15B:
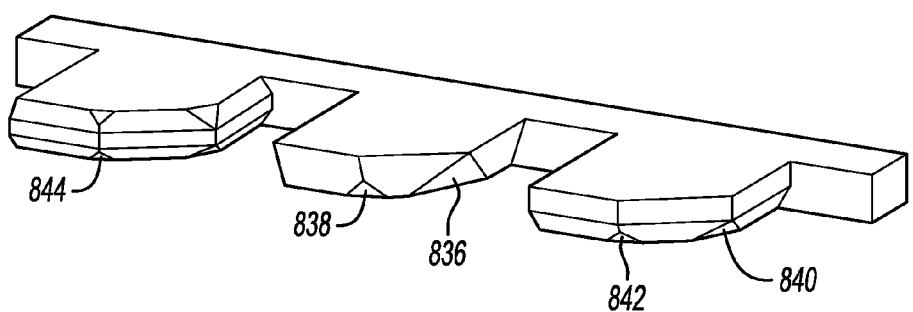

FIGS. 15A and 15B are illustrative examples of a three-dimensional view of a solid model that comprises vertex bevels. A vertex bevel comprises a topology description that may be created in a three-dimensional modeler using a vertex chamfer. As shown in FIG. 15A, the vertex bevel may include a triangular face 806 with an edge connected to top skin 802 and a vertex 808 connected to bottom skin 804. As shown in FIG. 15A, other vertex bevels include a triangular face 810 at a first level face which is opposite of the triangular face 814 connected through a common vertex 812.

Figure 16A:
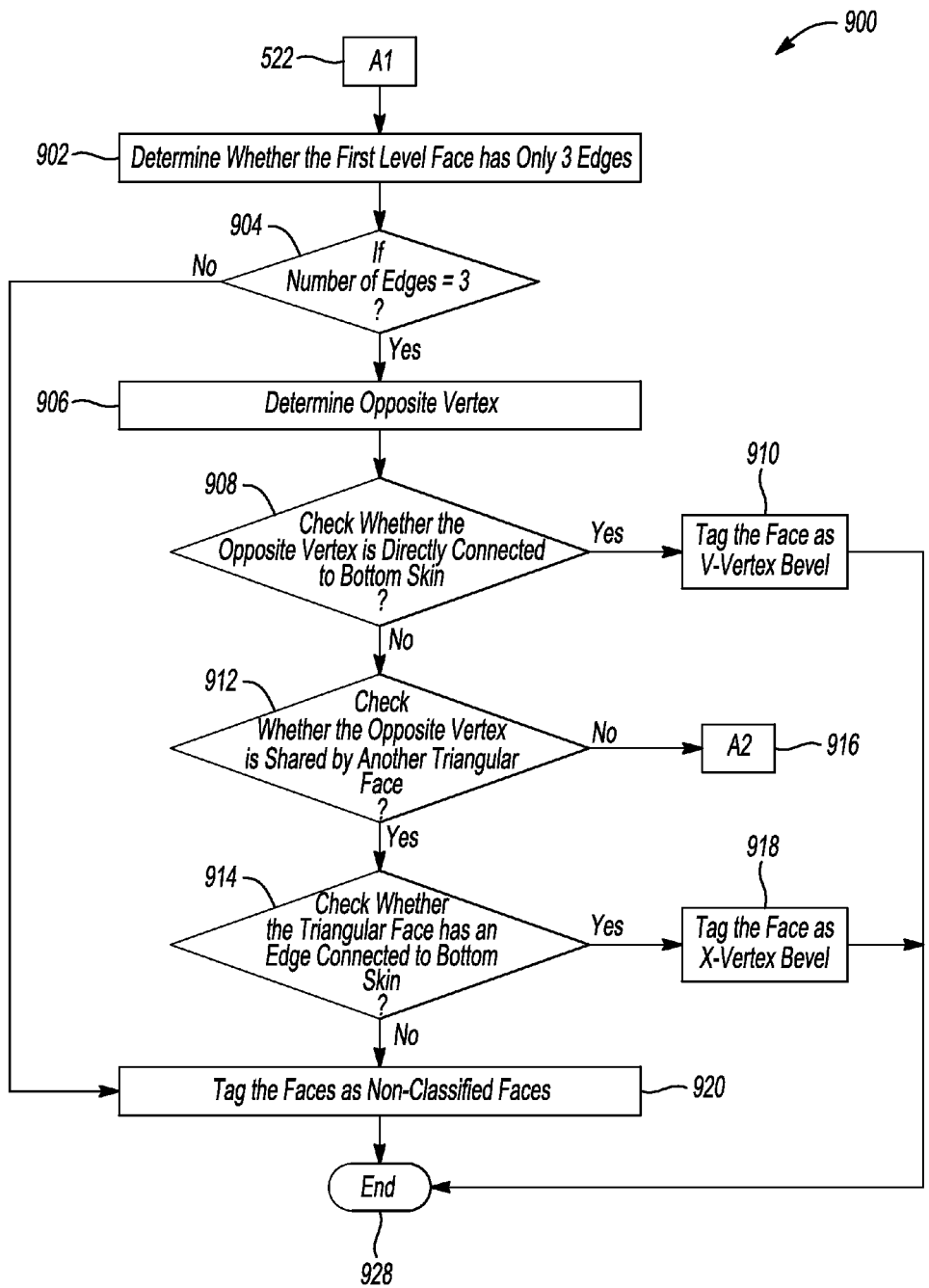
FIG. 16A is a flow chart of a vertex bevel feature recognition method which is a continuation of bevel feature recognition method.

FIG. 16A is a flow chart of a vertex bevel feature recognition method 900 which is a continuation of the bevel feature recognition method. The bevel feature recognition method in FIG. 5 (FIG. 5A through 5D) may determine a first level face(s). If an opposite edge of the first level face is not found, then the method in FIG. 5 may begin the vertex bevel feature recognition method in operation 522. The vertex bevel feature recognition method 900 may recognize a vertex bevel of a solid model using one or more controllers executing a computer algorithm, machine executable code, or software instructions programmed into a suitable programmable logic device(s) of the controller such as the controller of a computer, the one or more controllers at a server, or a combination thereof. Although the various operations shown in the flowchart diagram 900 appear to occur in a chronological sequence, at least some of the operations may occur in a different order, and some operations may be performed concurrently or not at all.

In operation 902, the method 900 may continue to analyze the solid model to determine the number of edges in the first level face. The method may check if the first level face comprises only three edges in operation 904.

In operation 906, if the first level face has only three edges, the method 900 may determine the opposite vertex. Fox example, as shown in FIG. 15A, if the first level face 806 comprises three edges, the method 900 may then determine the vertex 808 as the opposite vertex which is not shared by the bounding loop edge of the first level face in operation 906. If the first level face 806 does not comprise three edges, the method 900 may tag the one or more faces as a non-classified face in operation 920. For example, if the first level face has more than three edges, then the face is classified as non-classified face.

In operation 908, the method 900 may check if the opposite vertex 808 is directly connected to bottom skin. If the opposite vertex is connected to the bottom skin, the method may tag the first level face as a V-vertex bevel in operation 910.

For example, as shown in FIG. 15A, the triangular face 806 has an opposite vertex 808 directly connected to the bottom skin 804 and therefore the method may classify the triangular faces 806 as a V-vertex bevel.

In operation 912, if the opposite vertex is not connected to the bottom skin, the method may check whether the opposite vertex is shared by another triangular face. If the opposite vertex of the first level face is not connected to another triangular face, the method may further process the bevel to determine if it is a Y-vertex bevel or a K-vertex bevel in operation 916.

In operation 914, if the opposite vertex of the first level face is connected to another triangular face, the method checks whether the second triangular face has an edge connected to the bottom skin. If the second triangular face is directly connected to bottom skin, the method may tag the faces as an X-vertex bevel in operation 918.

For example, as shown in FIG. 15A, the triangular face 810 and triangular face 814 are connected at the vertex 812. The triangular face 814 is directly connected to the bottom skin 804 and therefore the method may classify the triangular faces 810 and 814 as an X-vertex bevel.

In operation 920, if the opposite vertex of the first level triangular face is connected to another triangular face, which does not have an edge connected to the bottom skin, the method may tag the one or more faces as non-classified face(s).

Figure 16B:
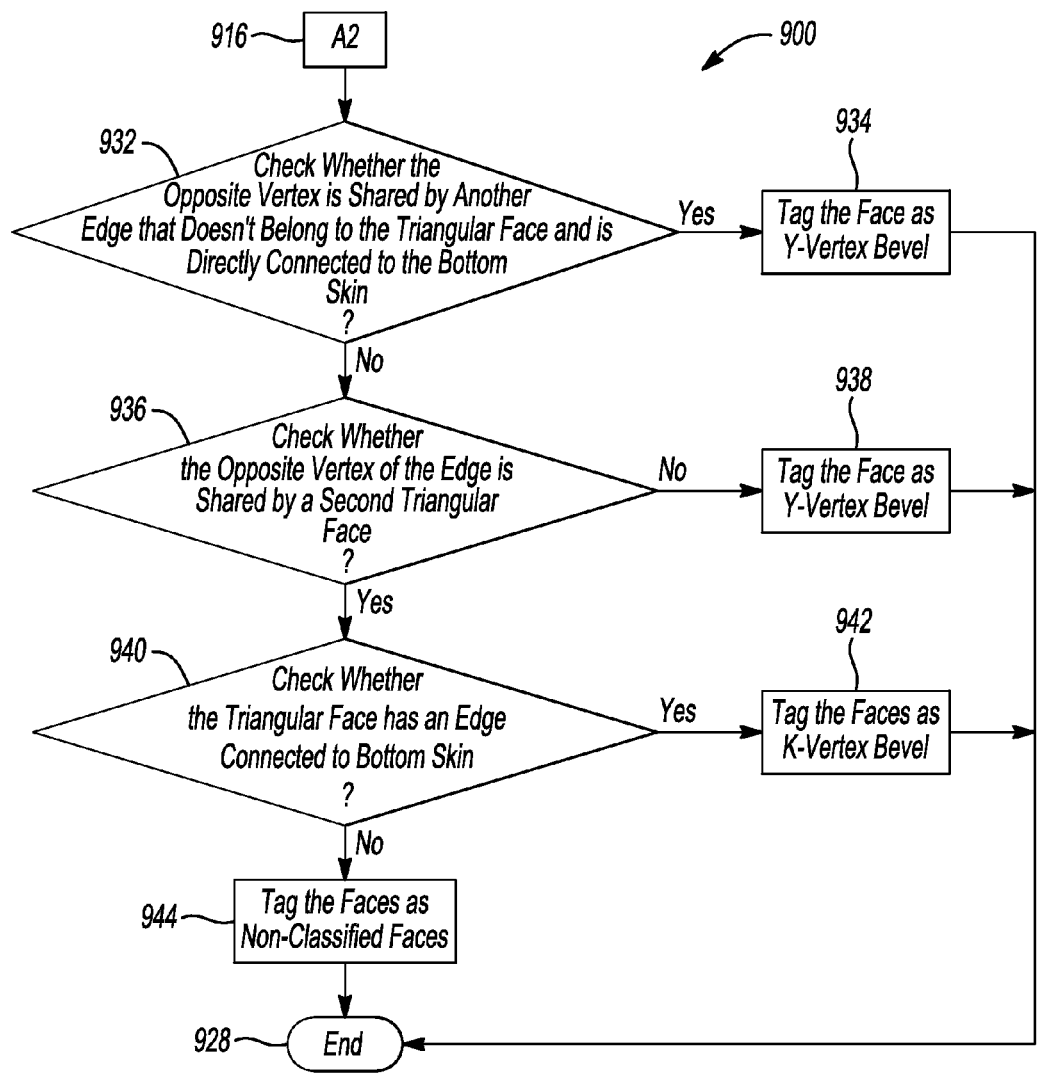
FIG. 16B is a flow chart continuation of the vertex bevel feature recognition method which is a continuation of bevel feature recognition method.

FIG. 16B is a flow chart continuation of the vertex bevel feature recognition method which is a continuation of the bevel feature recognition method. When an opposite vertex of a first level triangular face is not directly connected to the bottom skin and not shared by another triangular face, the method may continue to analyze the solid model to determine the vertex bevel in operation 916. The method may determine that the opposite vertex may comprise a Y-vertex bevel or a K-vertex bevel.

In operation 932, the method may check whether the opposite vertex is shared by another edge that doesn't belong to the triangular face and is directly connected to the bottom skin. If the opposite vertex of the first level face is shared by another edge that does not belong to first level triangular face and is directly connected to bottom skin, the method may recognize that the first level face is a Y-vertex bevel in operation 934.

In one example as illustrated in FIG. 15A, a first level triangular face 816 is connected to an edge 818, which is directly connected to the bottom skin 804 and therefore the method may recognize the first level triangular face 816 connected to the edge 818 as a Y-vertex bevel. In another example illustrated in FIG. 15A, the first level face 820, 824, and 826 may also be tagged as a Y-vertex bevel with additional checks.

In operation 936, the method may check whether the opposite vertex of the edge connected to the first triangular face is shared by a second triangular face. If the edge is not connected to the second triangular face, the method may tag the first level triangular face as a Y-vertex bevel in operation 938.

In operation 940, if the edge is connected to a second triangular face, the method may check whether the second triangular face has an edge connected to the bottom skin. If the second triangular face has an edge that is connected to the bottom skin, the method may tag the first level triangular face and second triangular face are K-vertex bevel in operation 942.

In the illustrative example shown in FIG. 15A, a first level triangular face 830 is connected to an edge 832, which is connected to a second triangular face 834 connected to the bottom skin 804. The first level triangular face 830 and the second level triangular face 834 are tagged by the method as a K-vertex bevel.

In operation 944, if none of the above checks are satisfied for any first level triangular face, then the method may tag the face as a non-classified face. Once the method completes the recognition of the one or more vertex bevels in the solid model, the method may end the process in operation 928.

Figure 17:
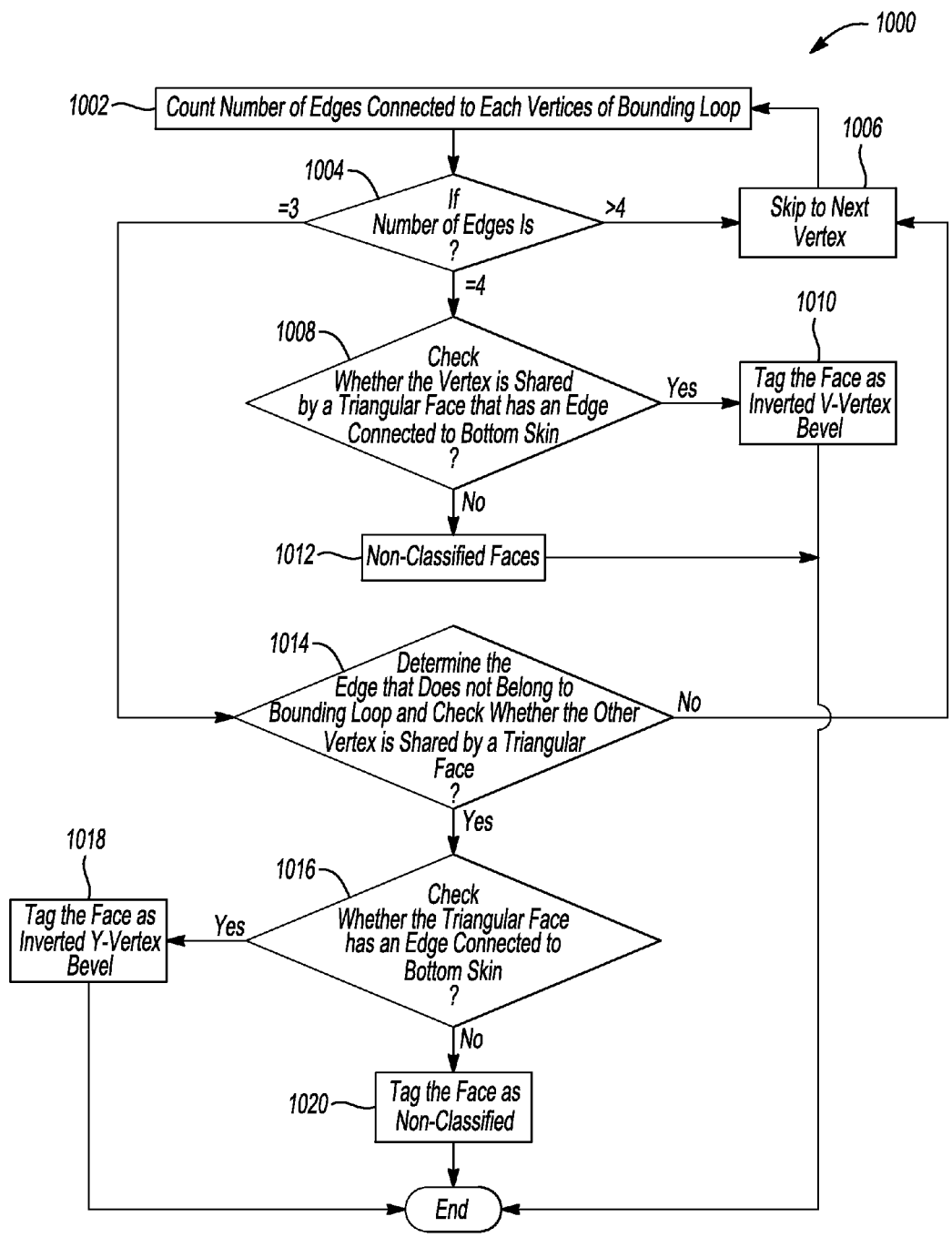
FIG. 17 is a flow chart of an inverted vertex bevel feature recognition method which is a continuation of bevel feature recognition method.

FIG. 17 is a flow chart of an inverted vertex bevel feature recognition method which is a continuation of bevel feature recognition method. The inverted vertex bevel feature recognition method may process the unclassified other faces and recognize as an inverted V-bevel and an inverted Y-bevel feature. The inverted vertex bevel feature recognition method 1000 may recognize an inverted vertex bevel of a solid model using one or more controllers executing a computer algorithm, machine executable code, or software instructions programmed into a suitable programmable logic device(s) of the controller such as the controller of a computer, the one or more controllers at a server, or a combination thereof. Although the various operations shown in the flowchart diagram 1000 appear to occur in a chronological sequence, at least some of the operations may occur in a different order, and some operations may be performed concurrently or not at all.

In operation 1002, the method 1000 may determine the number of edges connected to each vertex of a bounding loop. In response to the number of edges connected in operation 1004, if the vertex is connected to more than four edges, the method 1000 may skip to the next vertex in operation 1006.

In operation 1008, if the vertex is connected to four edges, the method 1000 may check if the vertex is shared by a triangular face that has an edge connected to the bottom skin. If the triangular face has an edge connected to the bottom skin, the method may tag the triangular face as an inverted V-vertex bevel in operation 1010. In the example illustrated in FIG. 15B, the triangular face 836 is tagged as an inverted V-vertex bevel. If the triangular face has an edge that does not connect to the bottom skin, the method may recognize the triangular face as a non-classified face in operation 1012.

In operation 1014, if the vertex is connected to three edges, the method 1000 may check if any of the edges that do not belong to a bounding loop have another vertex connected to a triangular face. In response to the edges that do not belong to the bounding loop not having another vertex connected to the triangular face, the method may skip to the next vertex in operation 1006.

In operation 1016, the method may check whether the triangular face has an edge connected to the bottom skin. If the triangular face has an edge connected to the bottom skin, the method may tag the triangular face as an inverted Y-vertex bevel in operation 1018.

In the example illustrated in FIG. 15B, the triangular faces 838 and 840 are tagged as inverted Y-vertex bevels. If any triangular faces remain untagged, and if such faces have an edge connected to bottom skin, the method may tag these faces as inverted Y-vertex bevels. For example, as illustrated in FIG. 15B, triangular faces 842 and 844 may be tagged by the method as inverted Y-vertex bevels.

In operation 1020, if the triangular face has an edge that is not connected to the bottom skin, the method may tag the triangular face as a non-classified face.

Figure 18:
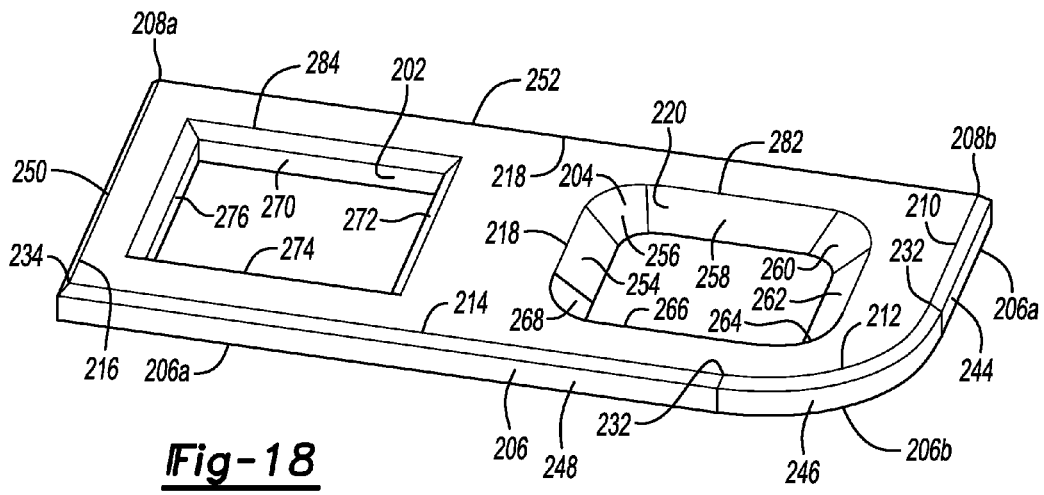
FIG. 18 is a three-dimensional view continued from the solid model in FIG. 2 that shows various bevel chains and various end types like isolated ends, tangential ends and non-tangential ends.

FIG. 18 is a three-dimensional view continued from the solid model in FIG. 2 that shows various bevel chains and various end types like isolated ends, tangential ends and non-tangential ends. Bevel features may be adjacent to one another with a different type of end connectivity. A method may recognize adjacent bevel features based on several inputs including a top skin, bottom skin, and one or more bevels.

For example, the ends of each bounding loop edge are attached to two edges, a first adjacent edge and a second adjacent edge. As illustrated in FIG. 18, the bounding loop edge 212 is attached to two edges, edge 210 and edge 214. Hence for bounding loop edge 212, the edge 210 and the edge 214 are tagged as the first adjacent edge and the second adjacent edge, respectively. In FIG. 18, bounding loop edge 214 is attached to edge 212 and edge 216 which are tagged as the first adjacent edge and the second adjacent edge, respectively.

Figure 19:
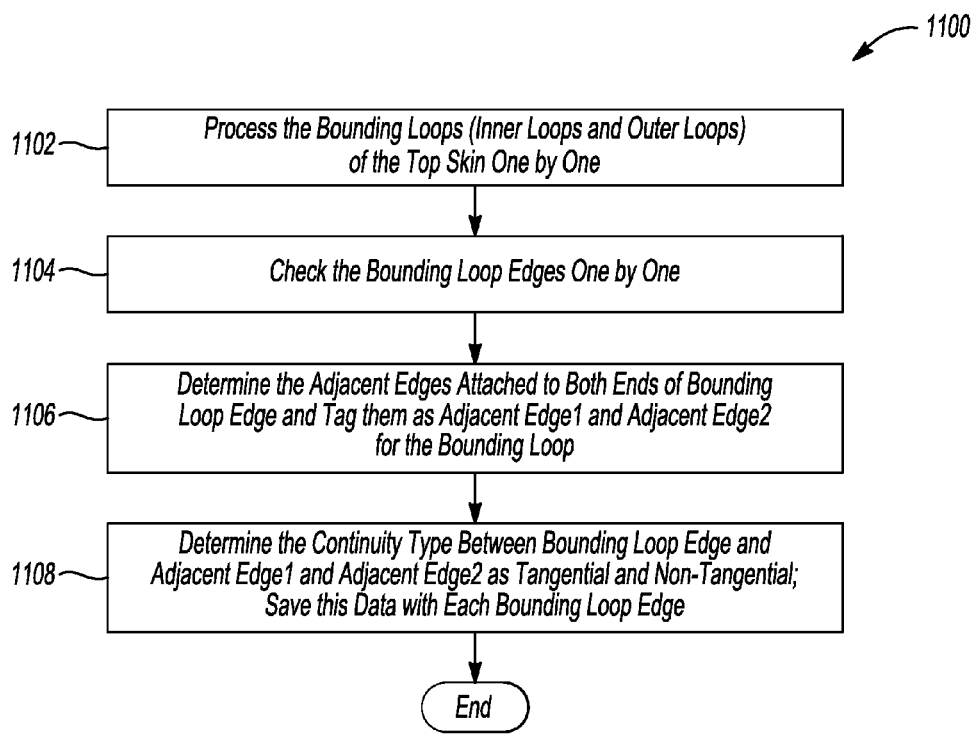
FIG. 19 is a flow chart of a adjacency determination method.

FIG. 19 is a flow chart of an adjacency determination method. The adjacency determination method 1100 may recognize a bevel chain using one or more controllers executing a computer algorithm, machine executable code, or software instructions programmed into a suitable programmable logic device(s) of the controller such as the controller of a computer, the one or more controllers at a server, or a combination thereof. Although the various operations shown in the flowchart diagram 1100 appear to occur in a chronological sequence, at least some of the operations may occur in a different order, and some operations may be performed concurrently or not at all.

In operation 1102, the method 1100 may process the bounding loops of the top skin of the solid model. The bounding loops may include the inner bounding loops and outer bounding loops. The method may check the bounding loop edges one by one in operation 1104.

In operation 1106, the method may recognize the adjacent edges attached to both ends of a bounding loop edge. The method may identify the adjacent edges for the bounding loop as a first adjacent edge and a second adjacent edge. The method may recognize the continuity type between a bounding loop edge and the first adjacent edge and the second adjacent edge in operation 1108. The continuity type between the bounding loop edges and the adjacent edges may include a tangential and non-tangential continuity. The method may also recognize if the non-tangential continuity has an end that is concave or convex. The method may save the data for each bounding loop edge.

Each bevel has two bevel ends, a first bevel end connected to the first adjacent edge and a second bevel end connected to the second adjacent edge. For every bevel as shown in FIG. 18, the ends of the bevels attached to each bounding loop edge may be recognized by the method as an isolated end 208 (e.g., 208a, 208b), a tangential end 232, a non-tangential end 234 and a dissimilar end (illustrated in FIG. 20 as dissimilar end 1208a, 1208b, 1208c). The method may recognize an end as an isolated end, if an adjacent edge of a bounding loop edge is not attached to any bevel feature. The method recognizes an end as a dissimilar end based on an adjacent edge of a bounding loop edge attached to a bevel feature which is of either different bevel type or the same bevel type with different bevel parameters such as a bevel angle, width, height and slant height. If an adjacent edge of a bounding loop edge is attached to a bevel feature of the same bevel type with the same bevel parameters, the method recognizes an end as a tangential end or a non-tangential end based on the edge continuity of the end.

Figure 21:
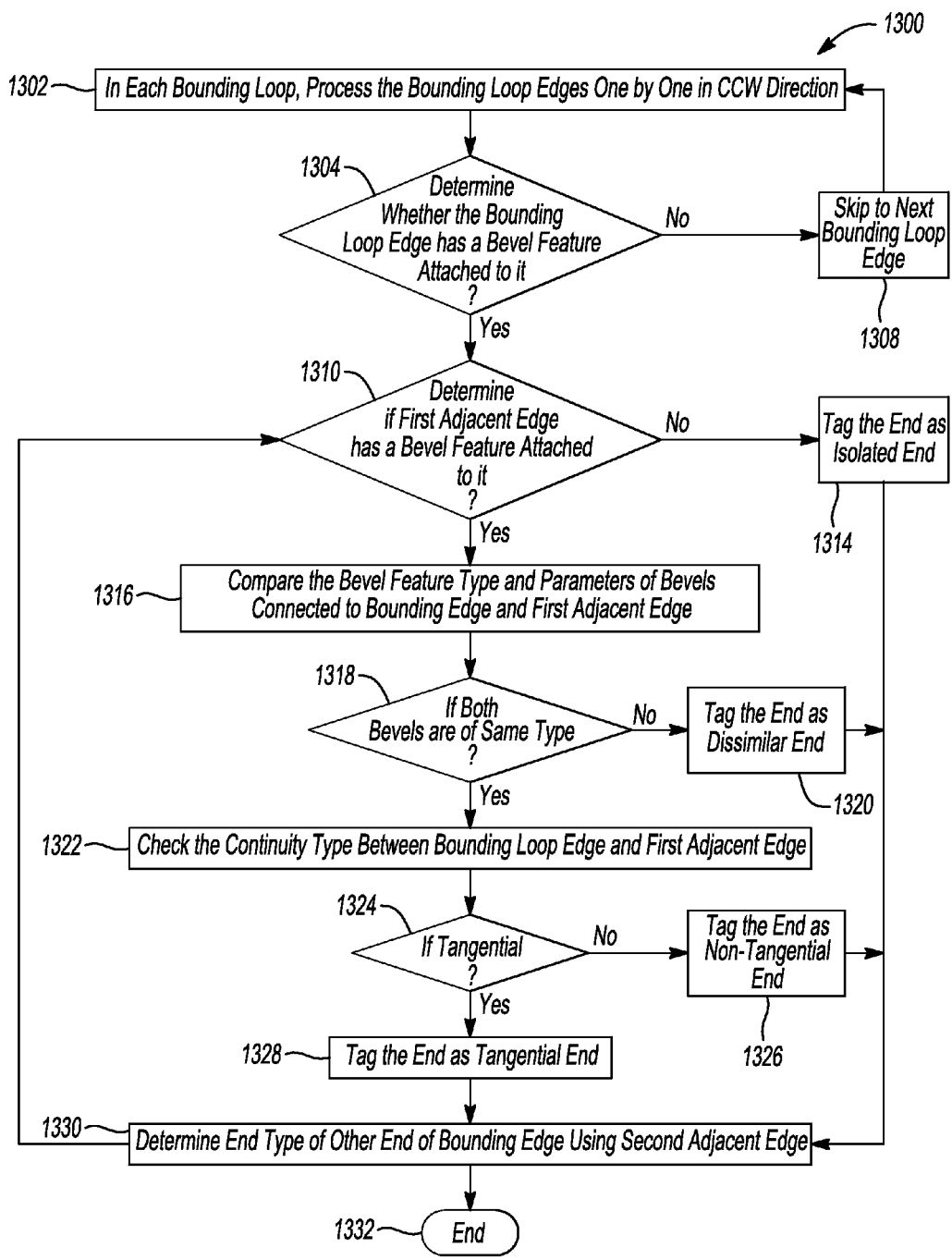
FIG. 21 is a flow chart of an end type recognition method for determining end types of bevels.

FIG. 21 is a flow chart of an end type recognition method 1300 for determining end types of bevels. The bounding loop edges may include an isolated end, a dissimilar end, a tangential and non-tangential end. The end type recognition method 1300 may recognize end types of a bevel using one or more controllers executing a computer algorithm, machine executable code, or software instructions programmed into a suitable programmable logic device(s) of the controller such as the controller of a computer, the one or more controllers at a server, or a combination thereof. Although the various operations shown in the flowchart diagram 1300 appear to occur in a chronological sequence, at least some of the operations may occur in a different order, and some operations may be performed concurrently or not at all.

In operation 1302, the method may process a bounding loop edge one by one in counter clockwise direction (CCW) direction in each bounding loop. The method 1300 may determine whether the bounding loop edge has a bevel feature attached to the edge in operation 1304.

In operation 1308, if the bounding loop edge is not attached to a bevel feature, the method may skip to the next bounding loop edge for processing.

Figure 22:
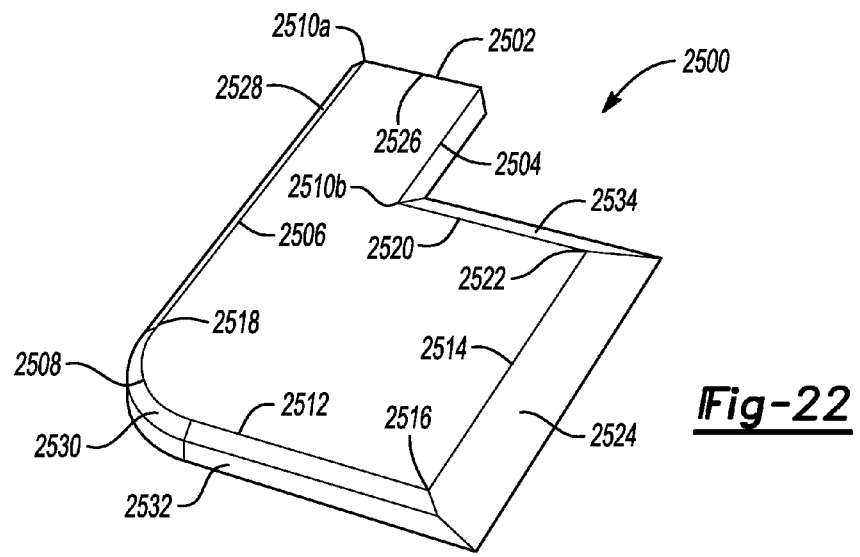
FIG. 22 is a three-dimensional view of a solid model that shows various end types like isolated ends, tangential ends, non-tangential ends and dissimilar ends.

For example, FIG. 22 is a three-dimensional view of a solid model that shows adjacent edges such that edge 2502 has a first adjacent edge 2504 and second adjacent edge 2506. Since edge 2502 is not attached to any bevel feature, edge 2502 is skipped and edge 2506 is taken for processing next.

In operation 1310, if the bounding loop edge is attached to a bevel feature, the method may determine if a first adjacent edge has a bevel feature attached to it. If the first adjacent edge is not attached to a bevel feature, the method may tag the end as an isolated end in operation 1314.

For example, in FIG. 22, bounding loop edge 2506 has a first adjacent edge 2502 and a second adjacent edge 2508. First adjacent edge 2502 is not connected to a bevel feature and hence the end between the bound loop edge 2506 and adjacent edge 2502 is tagged as an isolated end 2510a.

If the first adjacent edge is attached to the bevel feature, the method may compare the bevel feature type and parameters of the bevels connected to the bounding edge and the first adjacent edge in operation 1316.

For example, the bevel at the bounding edge and the bevel at the first adjacent edge may have the same bevel type with the same bevel parameters including bevel angle, width, height and slant height. If both of the bevels are of a different bevel type, the method may tag the end as a dissimilar end in operation 1320.

For example, in FIG. 22, the bounding loop edge 2512 has an adjacent edge 2514. Since the bevels connected to bounding loop edge 2512 and adjacent edge 2514 are of different bevel types, the end is tagged as a dissimilar end 2516.

In operation 1322, if both the bounding edge bevel and the first adjacent edge bevel are of same bevel type, the method may check the continuity type between the bounding loop edge and the first adjacent edge. The method may check if the continuity type between the bounding loop edge and the first adjacent edge are tangential in operation 1324.

In operation 1328, if the continuity type between the bounding loop edge and the first adjacent edge is tangential, the method may tag the end as a tangential end. In operation 1326, if the continuity type between the bounding loop edge and the first adjacent edge is not tangential, the method may tag the end as a non-tangential end.

For example, in FIG. 22, bounding loop edge 2506 has an adjacent edge 2508. Since the bevels connected to bounding loop edge 2506 and adjacent edge 2508 are of same bevel types as well as the continuity between the bounding loop edge and the adjacent edge is tangential, the end is tagged as a tangential end 2518. Similarly, bounding loop edge 2514 has an adjacent edge 2520. Since the bevels connected to bounding loop edge 2514 and adjacent edge 2520 are of same bevel types as well as the continuity between the bounding loop edge and the adjacent edge is non-tangential, the end is tagged as a non-tangential end 2522.

In response to the recognition of the end type for the first adjacent edge, the method may continue to process the data for the second adjacent edge in operation 1330. The method may repeat the operations 1310 through 1328 to recognize the end type of the second adjacent edge. Once the method completes the recognition of the end types for the boundary loop(s) in the solid model, the method may end the process in operation 1332.

For all vertex bevels, the method may tag both ends as dissimilar ends directly without making any checks. The method may recognize that vertex bevels are also tagged as a single bevel and are not considered for bevel chain recognition. The method may determine that the single bevel cannot be a part of any bevel chain. The method may continue to process the solid model to determine bevels chains. For example, the method may determine the bevel chains in the outer bounding loop 252 and inner bounding loops 282, 284, and classify the bevel chains in the loops as tangential bevel chains 220, non-tangential bevel chains 202 and mixed bevel chains 206 as shown in FIG. 18.

Figure 20:
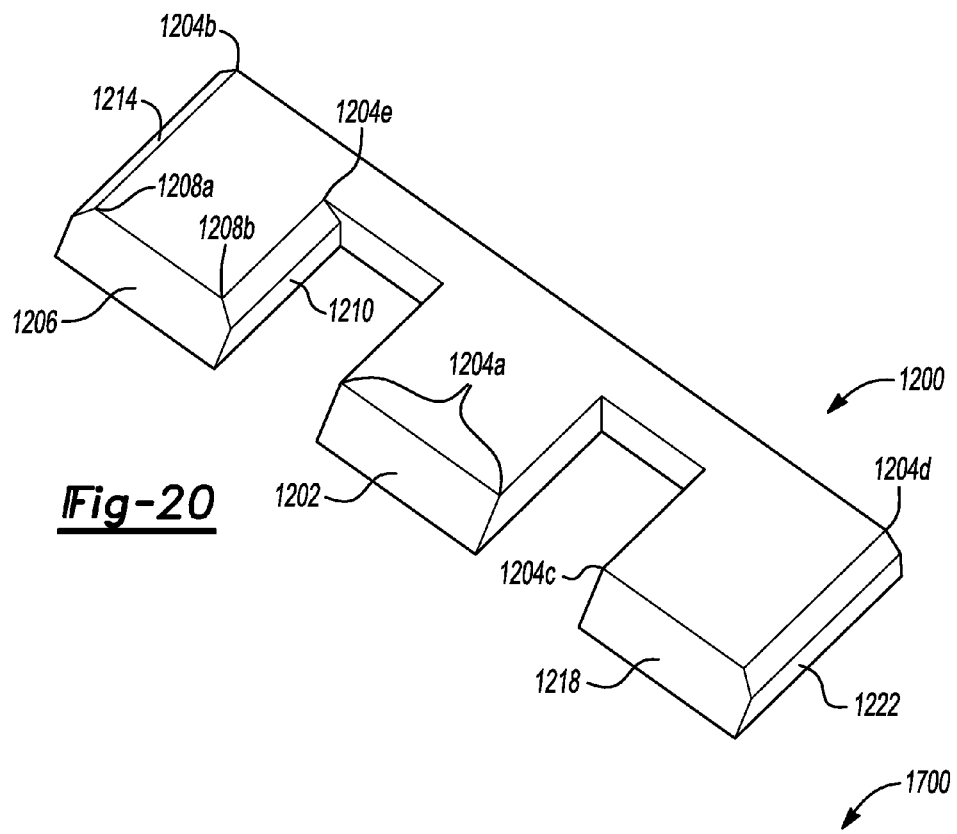
FIG. 20 is a three-dimensional view of a solid model that shows various single bevels with different end conditions.

Before the method may determine a bevel chain, single bevel(s) are identified first. The single bevels do not form part of any bevel chain as shown in FIG. 20. FIG. 20 is a three-dimensional view of a solid model 1200 that shows various single bevels with different end conditions. The bevels may be attached to a bounding loop edge. The bevels may include, but is not limited to, a V-bevel and a Y-bevel. The bounding loop may have the same bevel ends or a combination of bevel ends including, but not limited to, an isolated end 1204 (1204a through 1204e), a dissimilar end 1208 (1208a, 1208b) and a combination thereof.

Figure 23:
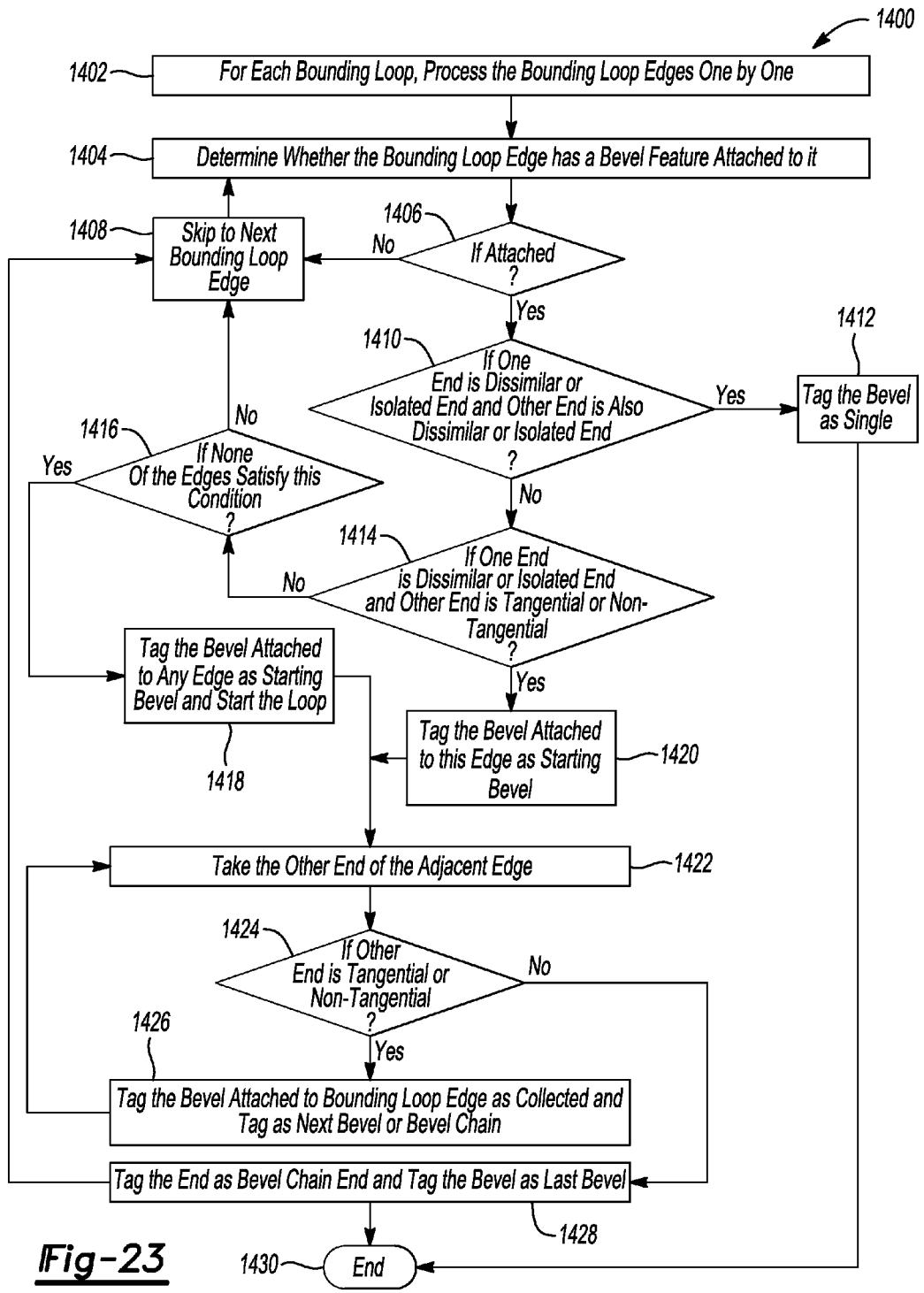
FIG. 23 is a flow chart of a bevel chain recognition method.

FIG. 23 is a flow chart of a bevel chain recognition method. The bevel chain recognition method 1400 may recognize a bevel chain using one or more controllers executing a computer algorithm, machine executable code, or software instructions programmed into a suitable programmable logic device(s) of the controller such as the controller of a computer, the one or more controllers at a server, or a combination thereof. Although the various operations shown in the flowchart diagram 1400 appear to occur in a chronological sequence, at least some of the operations may occur in a different order, and some operations may be performed concurrently or not at all.

In operation 1402, the method 1400 may process the bounding loop edges one by one for each bounding loop. The method may determine whether the bounding loop edge has a bevel feature attached to it in operation 1404.

In operation 1408 if the bevel feature is not attached to the bounding loop edge, the method may skip to the next bounding loop edge for continued processing. Bevels attached to bounding loop edges with both bevel ends as isolated ends or with both ends as dissimilar ends or one end as isolated end and another as dissimilar end are tagged as single bevels. To determine this, the following step is performed. If a bevel feature is attached to the bounding loop edge, the method may determine if the first bevel end is dissimilar end or isolated end and the second bevel end is dissimilar end or isolated end in operation 1410. If the check in operation 1410 is positive, the method may tag the bevel as a single bevel in operation 1412.

For example, in FIG. 20, bevel 1202 includes both bevel ends as isolated ends 1204. Bevel 1206 has both ends as dissimilar ends 1208. A bevel such as 1214 includes one end as an isolated end 1204*b* and another end as a dissimilar end 1208*a*. All such bevels 1202, 1206 and 1214 are identified as single bevels. Other single bevels shown in FIG. 20 include bevels 1210, 1218, and 1222.

A negative response to operation 1410, the method may determine if one end is a dissimilar or isolated end while the other end is a tangential or non-tangential end in operation 1414. If the first and second bevel ends have one end as a dissimilar or isolated end while the other is a tangential or non-tangential end, the method may tag the bevel attached to the edge as a starting bevel in operation 1420.

For example, in FIG. 18, assuming the method starts from bounding loop edge 216 of the outer bounding loop. The bevel 250 attached to the bounding loop edge 216 has a first bevel end as isolated end 208*a* and a second bevel end as non-tangential end 234 and hence bevel 250 is tagged as the starting bevel.

On negative response to operation 1414, in operation 1416, the method may process the other edges in the bounding loop edge to determine if the condition in operation 1416 is met. If none of the edges in the bounding loop edge satisfy this condition in operation 1416, the method may tag the bevel attached to any edge as the starting bevel and start the bevel loop in operation 1418. If all edges in the bounding loop are not processed yet in operation 1416, the method may skip to the next bounding loop edge in operation 1408.

For example, in FIG. 18, assuming the method starts processing from bounding loop edge 218 of the inner bounding loop. The bevel attached to the bounding loop edge 218 has both first and second bevel ends as tangential ends, which violates condition in operations 1410 and 1414. At this stage, since all the edges in the loop are not yet processed, the result for the check in operation 1416 is negative. So, the method skips to the next bounding loop edge in operation 1408. For this bounding loop, the result for the checks in operations 1410 and 1414 is negative for all the bevels attached to the bounding loop edges and this satisfies the condition in operation 1416. Hence the method may tag the bevel attached to any edge say bevel 254 attached to edge 218 as the starting bevel and start the bevel loop in operation 1418.

In operation 1422, the method may start processing the other end of the adjacent edge to recognize the end type. The method may determine if the other end of the adjacent edge is tangential or non-tangential end in operation 1424. On getting a positive response, the method may tag the bevel attached to the bounding loop edge as collected and tag as the next bevel of the bevel chain in operation 1426. The method may continue the process until the other end of the adjacent edge is neither tangential nor non-tangential.

For example, in FIG. 18, assuming the method starts from bounding loop edge 216 with bevel 250 as the starting bevel of the outer bounding loop. The other end of the adjacent edge 214 is tangential end 232 which satisfies the condition in operation 1424 and hence bevel 248 is tagged as the next bevel of the bevel chain in operation 1426. The method continues to process the next adjacent edge 212 and tags bevel 246 attached to it as the next bevel of the bevel chain.

In operation 1428, if the other end of the adjacent edge is neither tangential nor non-tangential, the method may tag the end as a bevel chain end and tag the bevel as the last bevel. The method may continue to the next bounding loop edge to determine other bevel chains in the bounding loop. Once the method completes the recognition of the bevel chain(s) in the bounding loop, the method may process other bounding loops, if any in the top skin and end the process in operation 1430. In bevel chains, except bevel chain ends that form start and end of the bevel chain, all other bevel ends are classified as intermediate bevel ends of the chain.

For example, in FIG. 18, after processing edge 212 and bevel 246 attached to it as the next bevel of the bevel chain, the method further processes the next adjacent edge 210. The other end of this edge 210 is an isolated end 208*b* and hence violates the condition given in operation 1424, and hence the other end 208*b* is tagged as bevel chain end and the bevel 244 attached to it as the last bevel of this bevel chain in operation 1428. Bevels 250, 248, 246 and 244 are recognized as a bevel chain. For the inner bounding loop 282, the method starts collecting the bevels 254-268 and tags bevel 268 as the last bevel and its last end as the bevel chain end. Thus, bevels 254-268 are recognized as a bevel chain. Similarly for bounding loop 284, bevels 270-276 are recognized as a bevel chain.

Figure 24:
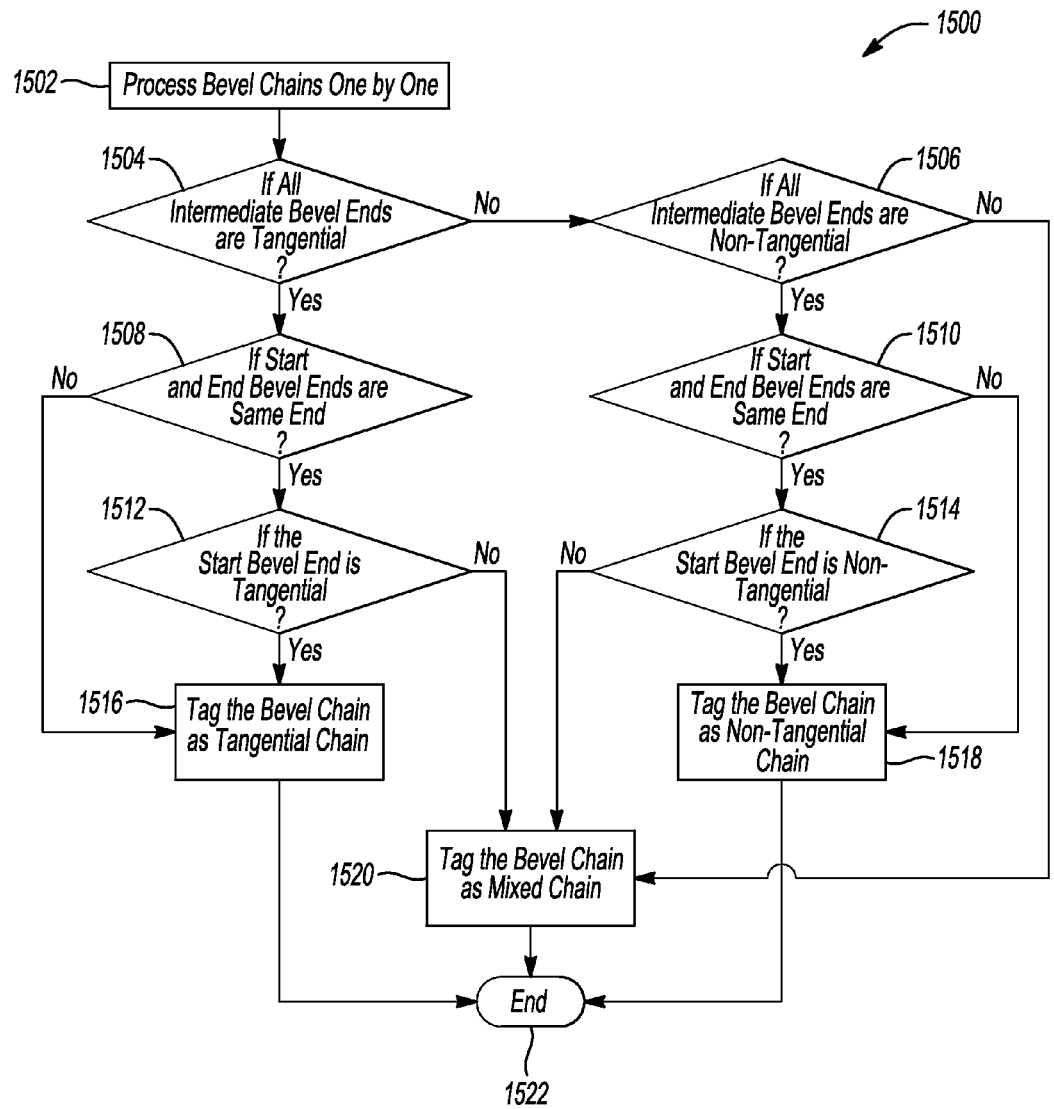
FIG. 24 is a flow chart of a bevel chain classification method.

FIG. 24 is a flow chart of a bevel chain classification method 1500. The bevel chain classification method 1500 may recognize a bevel chain using one or more controllers executing a computer algorithm, machine executable code, or software instructions programmed into a suitable programmable logic device(s) of the controller such as the controller of a computer, the one or more controllers at a server, or a combination thereof. Although the various operations shown in the flowchart diagram 1500 appear to occur in a chronological sequence, at least some of the operations may occur in a different order, and some operations may be performed concurrently or not at all.

In operation 1502, the method 1500 may process the bevel chain(s) one by one. The method may check whether all intermediate bevel ends are tangential except for the bevel chain ends in operation 1504.

If the intermediate bevel ends are tangential, the method may check whether the start and end bevel chain ends are same in operation 1508. This check may help to determine whether the bevel chain forms a closed loop. In response to a positive outcome in operation 1508, the method may further check whether this end is also a tangential bevel end. On receiving a positive outcome in operation 1512, the method may tag the bevel chain as a tangential chain in operation 1516. If the outcome is negative in operation 1508, the method may tag the bevel chain as a tangential chain in operation 1516.

For example, in FIG. 18, bevel chain consisting of bevels 254-268 includes all intermediate bevel ends as tangential in operation 1504. The start and end bevel chain ends are same for this bevel chain in operation 1508 as the bevels form a closed loop and this bevel end is recognized to be tangential in operation 1512 and hence this bevel chain is tagged as a tangential V bevel chain. In FIG. 22, the bevel chain consisting of bevels 2532, 2530, 2528 includes all intermediate bevel ends as tangential in operation 1504. However, the start and end bevel chain ends are not same for this bevel chain in operation 1508. Hence this bevel chain is tagged as a tangential Y bevel chain.

If the outcome is negative in operation 1504, the method may check whether all intermediate bevel ends are non-tangential except for the bevel chain ends in operation 1506. If the intermediate bevel ends are non-tangential, the method may check whether the start and end bevel chain ends are same to determine whether the bevel chain forms a closed loop in operation 1510. In response to a positive outcome in operation 1510, the method may further check whether this end is also a non-tangential bevel end. On receiving a positive outcome in operation 1510, the method may tag the bevel chain as a non-tangential chain in operation 1518. If the outcome is negative in operation 1510, the method may tag the bevel chain as a non-tangential chain in operation 1518.

For example, in FIG. 18, the bevel chain consisting of bevels 270-276 includes all intermediate bevel ends as non-tangential in operation 1506. The start and end bevel chain ends are same for this bevel chain in operation 1510 as the bevels form a closed loop and this bevel end is recognized to be non-tangential in operation 1514 and hence this bevel chain is tagged as a non-tangential Y bevel chain in operation 1518.

In another example, in FIG. 22, bevel chain consisting of bevels 2524 and 2534 includes all intermediate bevel ends as non-tangential 2522 in operation 1506. However, the start and end bevel chain ends are not same for this bevel chain in operation 1508. Hence this bevel chain is tagged as a tangential V bevel chain.

If the outcome is negative in operation 1506, all the intermediate bevel ends are neither tangential nor non-tangential; the method may tag the bevel chain as a mixed bevel chain in operation 1520. If the outcome is negative in operation 1512 or 1514, the method may tag the bevel chain as a mixed chain in operation 1520. Once the method completes the recognition of the bevel chain types for the boundary loop(s) in the solid model, the method may end the process in operation 1522.

For example, in FIG. 18, bevel chain including bevels 244-250 comprises a mix of tangential and non-tangential bevel ends. Hence this bevel chain is tagged as mixed Y bevel chain.

Figure 25:
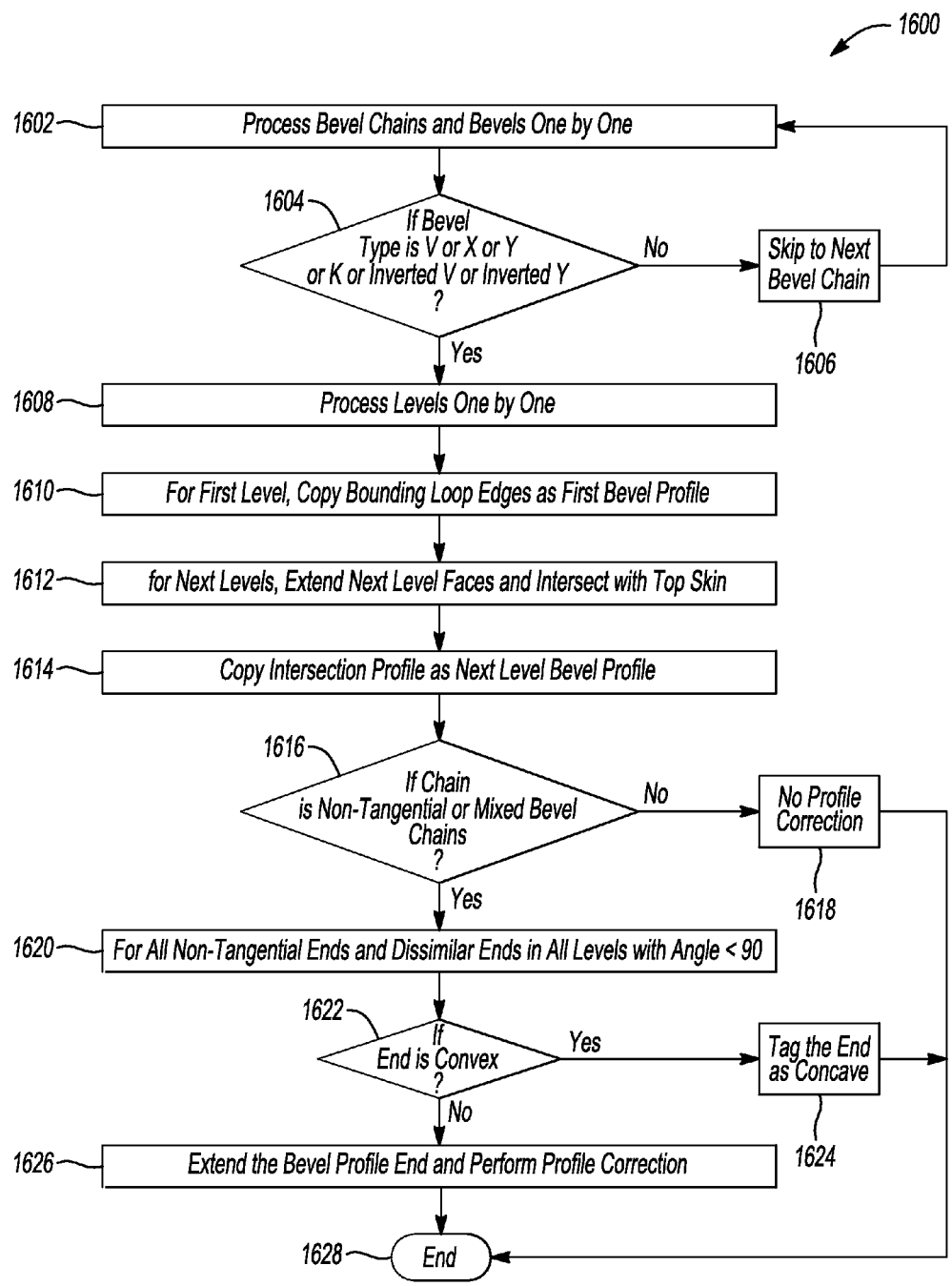
FIG. 25 is a flow chart of a bevel chain profile creation method.

FIG. 25 is a flow chart of a bevel profile creation method. The method may generate a bevel profile for each bevel chain and single bevel. The bevel profiles, along with bevel parameters, may be used for recreating bevel features or for generating tool paths for manufacturing, costing, etc. The method 1600 may generate a bevel profile for each level of each bevel chain in a solid model. The bevel chain profile creation method 1600 may create a profile for a bevel chain using one or more controllers executing a computer algorithm, machine executable code, or software instructions programmed into a suitable programmable logic device(s) of the controller such as the controller of a computer, the one or more controllers at a server, or a combination thereof. Although the various operations shown in the flowchart diagram 1600 appear to occur in a chronological sequence, at least some of the operations may occur in a different order, and some operations may be performed concurrently or not at all.

In operation 1602, the method may process one or more bevel chains and single bevels one by one. The method may determine if the bevel type is recognized as a V-bevel, Y-bevel, X-bevel, K-bevel, inverted V-bevel, or an inverted Y-bevel in operation 1604. If the bevel type is not recognized, the method may skip to the next bevel chain for processing in operation 1606.

In operation 1608, if the bevel type is recognized, the method may process the levels one by one for the bevel chain. The method may copy the bounding loop edges as first level bevel profile for the first level faces of the bevel chain in operation 1610.

In operation 1612, the method may extend the next level of faces and intersect with the top skin for the next levels. The method may copy the intersection profile as the next level bevel profile in operation 1614.

The bevel profiles generated by the method for non-tangential bevel chains and mixed bevel chains may require additional bevel profile corrections; however, for tangential bevel chains such bevel profile corrections are not needed. In operation 1616, the method may determine if the chain is non-tangential or a mixed bevel chain. If the check in operation 1616 is negative, the method may not perform a profile correction in operation 1618. If the check in operation 1616 is positive, the method may recognize non-tangential ends and dissimilar ends in all levels with an angle of less than ninety degrees in operation 1620, the method may determine if the bevel end is convex in operation 1622. If the check is negative in operation 1622, the method may tag the end as concave in operation 1624. If the check is positive in operation 1622, the method may extend the bevel profile end and perform bevel profile correction. Bevel profile correction is performed by creating a direction vector such that it is pointing towards the convex end from the other end of the bounding loop edge. The method may create perpendiculars from each vertex of a first level face to the direction vector of the bounding loop edge and determine intersection points. The method may determine the farthest intersection point from the convex end along the direction vector of bounding loop edge and extend the bevel profile up to this point.

For non-tangential convex ends and dissimilar convex ends with level angle greater than or equal to ninety degrees, the method may not perform bevel profile correction. For non-tangential concave ends and dissimilar concave ends with a level angle lesser than ninety degrees in all levels, the method may tag a bevel profile as a concave end so that suitable corrections may be done during post processing while creating tool paths or during recreating bevel features. In operation 1628, once the method completes the bevel profile creation of the bevel chain for the boundary loop(s) in the solid model, the method may end the process. The bevel profile generated by the method is shown in FIG. 26.

Figure 26:
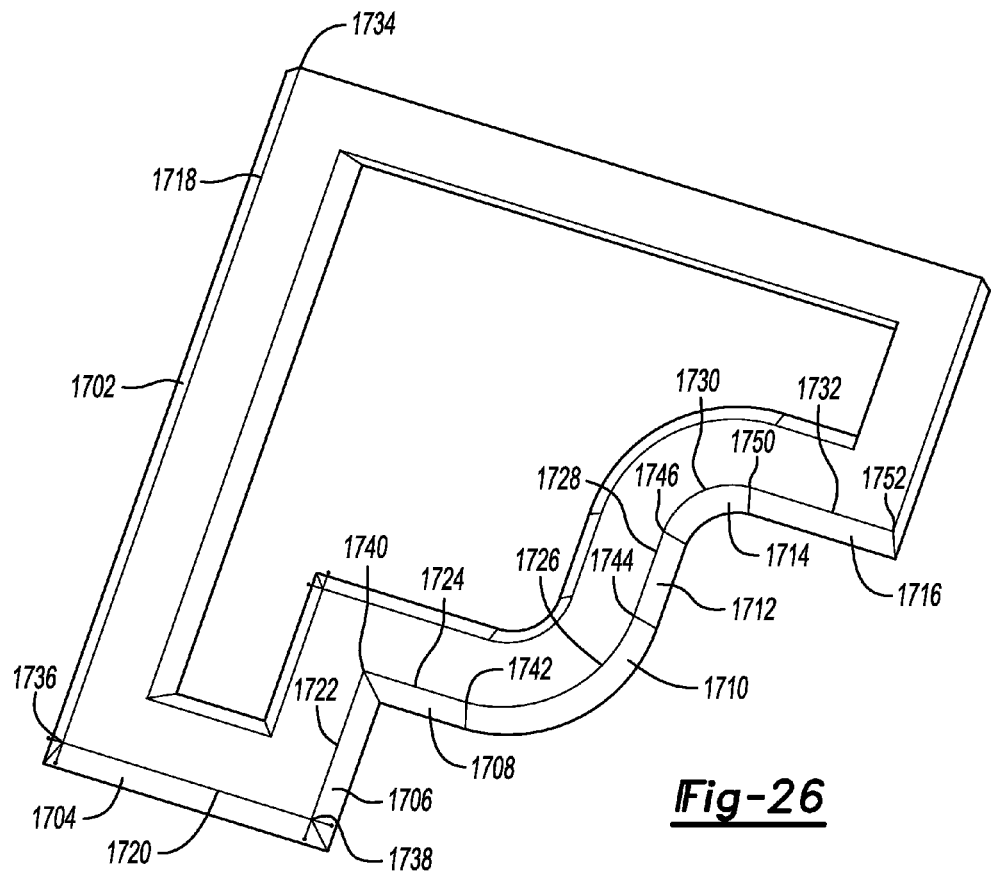
FIG. 26 is a three-dimensional view of a solid model that shows bevel profiles of mixed bevel chains with bevel corrections at non-tangential convex ends.

FIG. 26 is a three-dimensional view of a solid model that illustrates bevel profiles of a mixed V-bevel chain with bevel corrections at non-tangential convex ends. For example, a bevel profile 1718 for bevel 1702 is corrected at a non-tangential convex end 1736 by extending the bevel profile as per the method explained above. As the end 1734 is not identified as a non-tangential end, the method may not need to perform profile correction at this end.

Bevel 1704 has both ends 1736 and 1738 as non-tangential convex ends, therefore the method may perform bevel profile correction at both ends of 1720. Bevel 1706 has one end 1738 as non-tangential convex end and another end 1740 as non-tangential concave end. The method may perform bevel profile correction at convex end 1738 for bevel 1706 and tag end 1740 as concave ends for both bevels 1706 and 1708. The method may recognize that the ends 1742 through 1750 are tangential ends and 1752 is an isolated end, therefore profile corrections are not needed at these ends. For bevels attached to circular edges, convexity and concavity of bevels are also stored as feature information. The method may tag bevel 1710 as a convex circular bevel and 1714 as a concave circular bevel.

For V-bevel and an inverted V-bevel recognized on a solid model, the method may determine that the bevel only comprises one level therefore the method may generate one bevel profile. For inverted V bevel chains, all bevel angles greater than ninety degrees, corrections are not needed.

Figure 27:
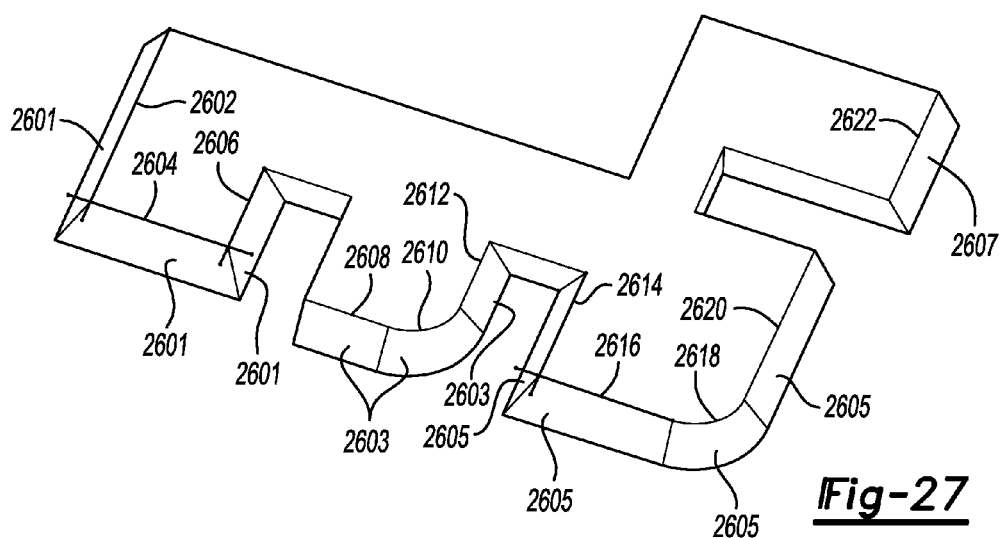
FIG. 27 is a three-dimensional view of a solid model that shows V-bevel chains.

FIG. 27 is a three-dimensional view of a solid model that shows V-bevel chains. For example, edges 2602, 2604, 2606 form the bevel profile for the non-tangential V bevel chain 2601. Similarly, edges 2608, 2610, 2612 form bevel profile for the tangential V bevel chain 2603. Edges 2614, 2616, 2618, 2620 form the bevel profile for the mixed V bevel chain 2605. Edge 2622 forms the bevel profile for the single V bevel 2607.

Figure 28:
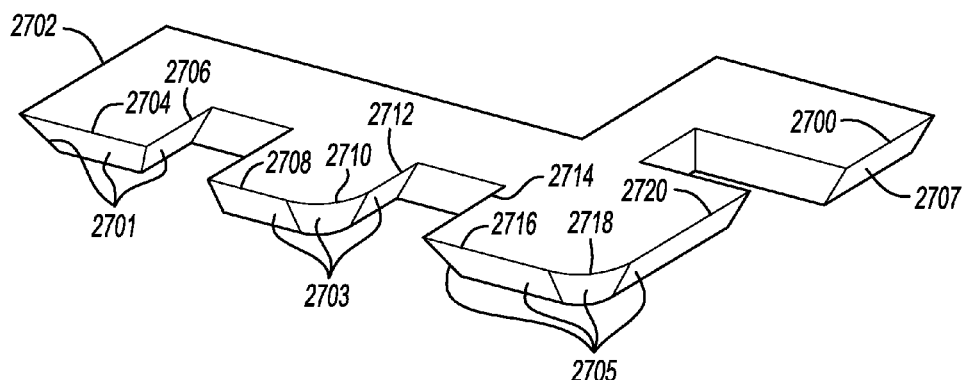
FIG. 28 is a three-dimensional view of a solid model that shows inverted V-bevel chains.

FIG. 28 is a three-dimensional view of a solid model that shows inverted V-bevel chains. For example, edges 2702, 2704, 2706 form the bevel profile for the non-tangential inverted-V bevel chain 2701. Similarly, edges 2708, 2710, 2712 form the bevel profile for the tangential inverted-V bevel chain 2703. Edges 2714, 2716, 2718, 2720 form the bevel profile for the mixed inverted V bevel chain 2705. Edge 2700 forms the bevel profile for the single inverted-V bevel 2707.

A Y-bevel, an inverted Y-bevel and an X-bevel may comprise two levels; therefore the method may generate two bevel profiles, one for a first level face and another for a second level face. First level faces in Y bevels and X bevels have level angles lesser than ninety degrees and are similar to V bevels. The method may generate the first level bevel profile for Y-bevel and X-bevel in a similar process as that of a V-bevel profile. For an inverted Y bevel, the first level angle is equal to ninety degrees, therefore the method may utilize the bounding loop edges itself as bevel profiles and any profile corrections are not performed. For inverted Y bevel and X bevel, the method may generate the second level bevel profile by extending the second level face so that they intersect with the top skin plane. The method may determine that the resultant intersection profile as the second level profile.

Figure 29:
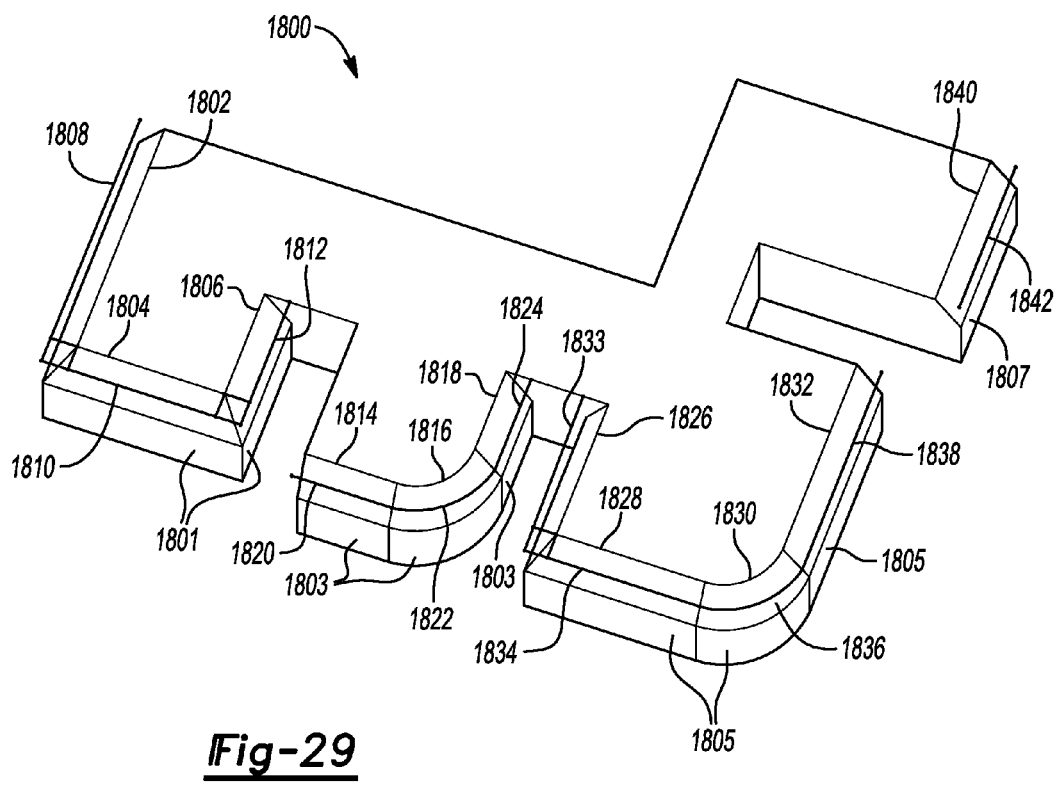
FIG. 29 is a three-dimensional view of a solid model that shows bevel profiles of Y-bevel chains.

FIG. 29 is a three dimensional view of a solid model that shows bevel profiles of Y-bevel chains. The Y-bevel chains include a non-tangential Y-bevel chain 1801, a tangential Y-bevel chain 1803, a mixed bevel chain 1805, and a single Y-bevel 1807. The non-tangential Y-bevel chain 1801 comprises a first level bevel profile 1802, 1804, 1806 and a second level bevel profile 1808, 1810, 1812. The tangential Y-bevel 1803 chain comprises a first level bevel profile 1814, 1816, 1818 and a second level bevel profile 1820, 1822, 1824. The mixed Y-bevel chain 1805 comprises a first level profile 1826, 1828, 1830, 1832 and a second level profile 1833, 1834, 1836, 1838. The single Y-bevel 1807 comprises a first level profile 1840 and a second level profile 1842.

Figure 30:
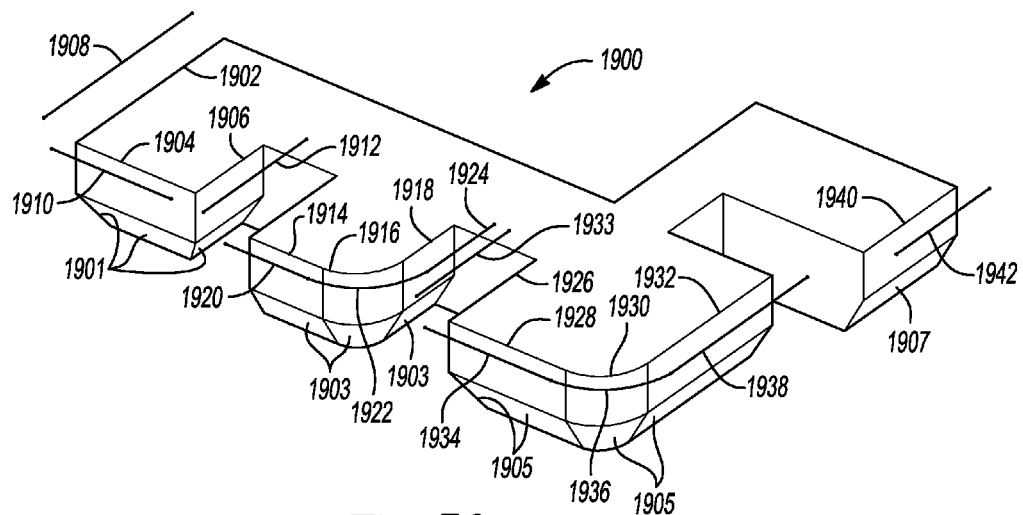
FIG. 30 is a three-dimensional view of a solid model that shows bevel profiles of inverted Y-bevel chains.

FIG. 30 is a three dimensional view of a solid model that shows bevel profiles of inverted Y-bevel chains. The bevel profiles for the inverted Y-bevel chains comprise a first and second level. For an inverted Y-bevel, the method may not generate a profile correction for second level at a non-tangential convex ends as the level angles are greater than ninety degrees. For non-tangential concave ends in the second level, the method may tag a bevel profile as a concave end. As shown in FIG. 30, the inverted Y-bevel chains include a non-tangential inverted Y-bevel chain 1901, a tangential inverted Y-bevel chain 1903, a mixed inverted Y-bevel chain 1905, and a single inverted Y-bevel 1907. The non-tangential inverted Y-bevel chain 1901 comprises a first level bevel profile 1902, 1904, 1906 and a second level bevel profile 1908, 1910, 1912. The tangential inverted Y-bevel 1903 chain comprises a first level bevel profile 1914, 1916, 1918 and a second level bevel profile 1920, 1922, 1924. The mixed inverted Y-bevel chain 1905 comprises a first level profile 1926, 1928, 1930, 1932 and a second level profile 1933, 1934, 1936, 1938. The single inverted Y-bevel 1907 comprises a first level profile 1940 and a second level profile 1942.

Figure 31:
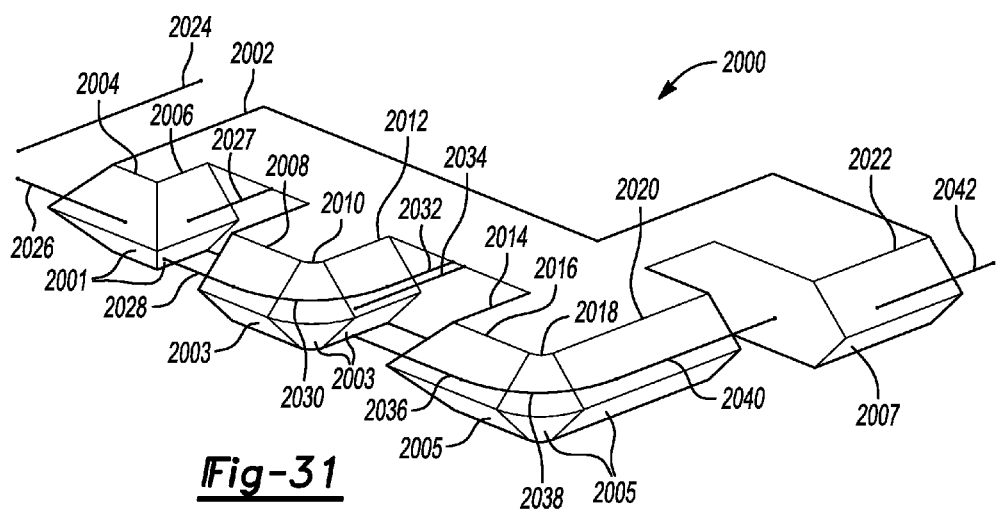
FIG. 31 is a three-dimensional view of a solid model that shows bevel profiles of X-bevel chains.
Figure 32:
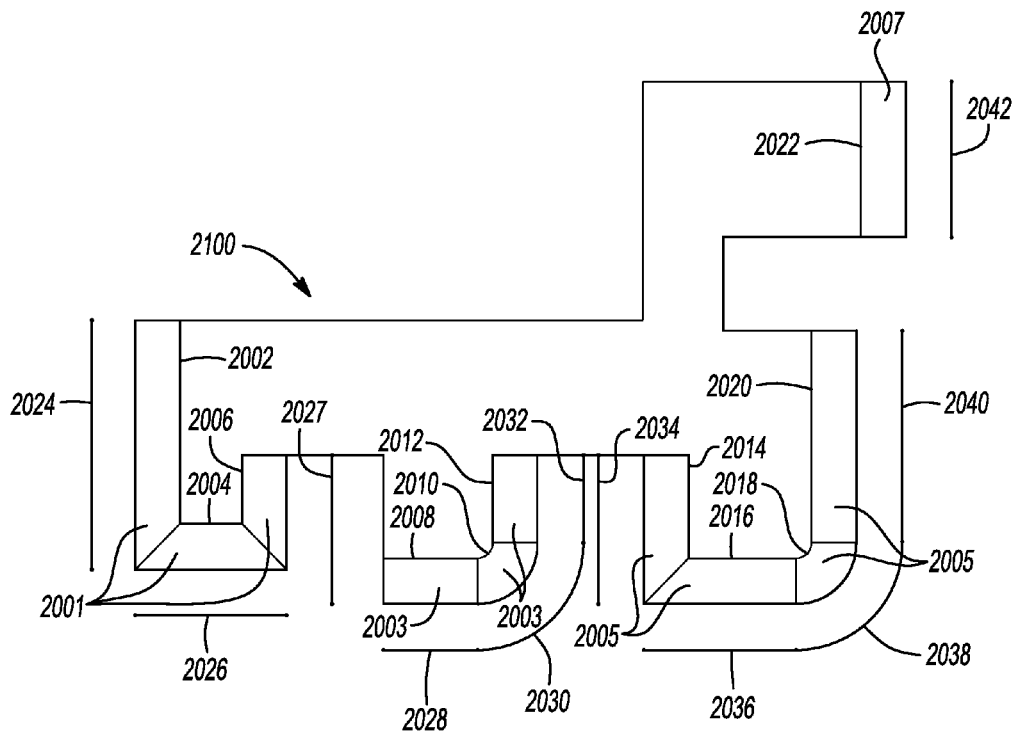
FIG. 32 is a top view of the solid model shown in FIG. 31.

FIG. 31 is a three dimensional view of a solid model that shows bevel profiles of X-bevel chains. FIG. 32 is a top view of the solid model shown in FIG. 31. The X-bevel chains include a non-tangential X-bevel chain 2001, a tangential X-bevel chain 2003, a mixed X-bevel chain 2005, and a single X-bevel 2007. The X-bevel chains comprise a first level bevel profile 2002, 2004, 2006, 2008, 2010, 2012, 2014, 2016, 2018, 2020, and 2022, and a second level bevel profile 2024, 2026, 2027, 2028, 2030, 2032, 2034, 2036, 2038, 2040, and 2042.

A K-bevel may comprise three levels; therefore the method may generate three bevel profiles, one for a first level face, another two for a second level face and a third for third level face. First level faces in K bevels have level angles lesser than ninety degrees and are similar to V bevels. The method may generate the first level bevel profile for K-bevel in a similar process as that of a V-bevel profile. For a K-bevel, the method may generate the second and third level bevel profiles by extending the second and third level face respectively so that they intersect with the top skin plane. For K bevels with non-tangential convex ends, first level profile is corrected at non-tangential end. For the second level, if angle is greater than or equal to ninety degrees, profile correction is not needed. If the second level angle is less than ninety degrees, then second level profile is corrected at non-tangential end. For third level, profile correction is not needed, as level angles are greater than ninety degrees. All non-tangential concave ends are tagged as concave ends.

Figure 33:
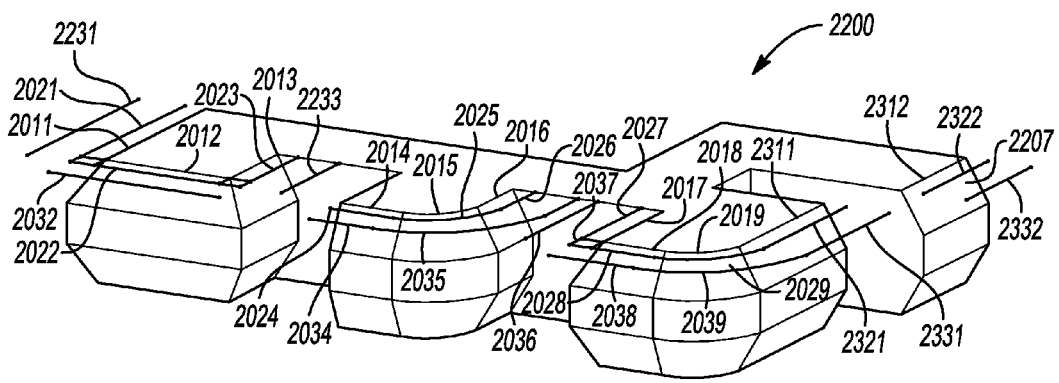
FIG. 33 is a three-dimensional view of a solid model that shows bevel profiles of various K-bevel chains.
Figure 34:
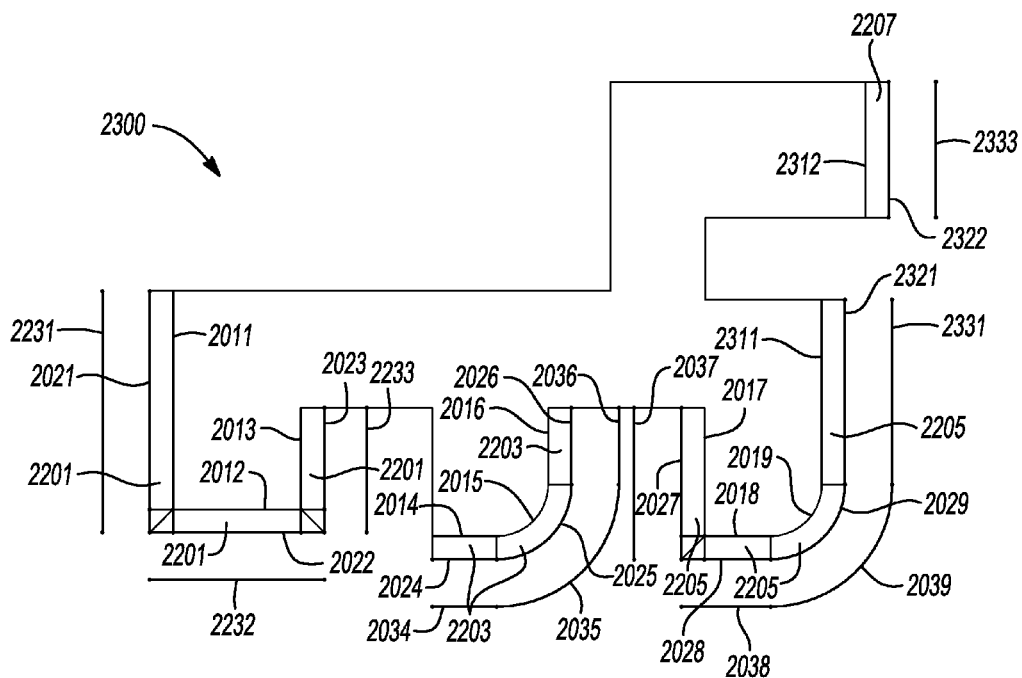
FIG. 34 is a top view of the solid model shown in FIG. 33.

FIG. 33 is a three-dimensional view of a solid model that shows bevel profiles of a various K-bevel chains. FIG. 34 is a top view of the solid model shown in FIG. 33. The K-bevel chains include a non-tangential Y-bevel chain 2201, a tangential Y-bevel chain 2203, a mixed Y-bevel chain 2205 and a single Y-bevel 2207. The K-bevel chains comprise a first level bevel profile 2011 through 2019, 2311 and 2312. The K-bevel chains comprise a second level bevel profile 2021 through 2029, 2321 and 2322. The K-bevel chains comprise a third level profile 2031 through 2039, 2331 and 2332.

Figure 35:
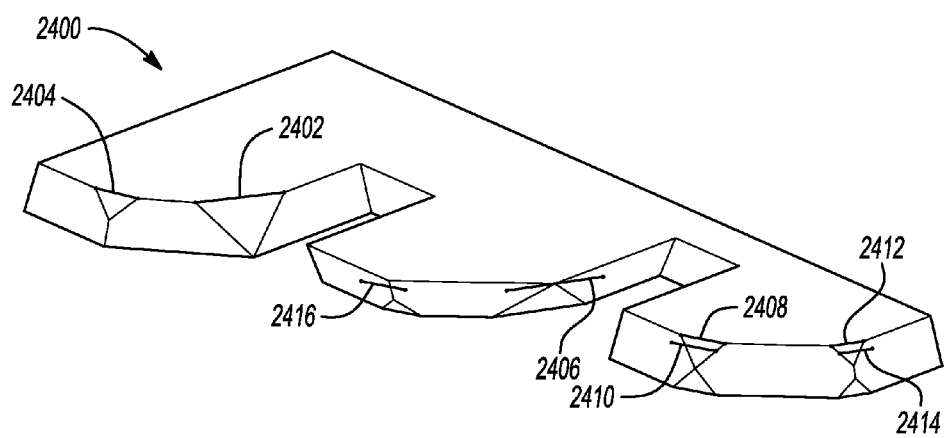
FIG. 35 is a three-dimensional view of a solid model that shows bevel profiles of various vertex bevels.

FIG. 35 is a three-dimensional view of a solid model that shows bevel profiles of various vertex bevels. Bevel profile generation for vertex bevels are processed separately as follows: V-vertex bevels and Y-vertex bevels have only one triangular face and the bounding loop edge itself form the bevel profile. As illustrated in FIG. 35, bevel profile for V-vertex bevel is 2402 and Y-vertex bevel is 2404. An inverted V-vertex bevels and inverted Y-vertex bevels have only one triangular face. The bevel face is extended and intersected with the top skin plane and the resulting intersection profile is the bevel profile. For example, the bevel profiles for inverted V-vertex bevel is 2406 and inverted Y-vertex bevel is 2416.

An X-vertex bevel and K-vertex bevel have two triangular faces. For first level triangular faces, bounding loop edge itself forms the first level bevel profile. For second level triangular faces, second level face is extended till the top skin and the resulting intersection profile forms the second level profile. For example, FIG. 35 illustrates the bevel profiles for X-vertex bevels as 2408, 2410 and the bevel profiles for K-vertex bevels 2412, 2414.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A computer-implemented product including instructions embodied in a non-transitory computer read-able medium that, when executed by a processor, cause the processor to
   receive a three-dimensional model of a part;
   recognize a bevel feature via a bevel feature recognition module configured to recognize bevel features and different types of vertex bevels based on the three-dimensional model;
   recognize a type of connected bevels via a bevel chain recognition module for classifying them as tangential bevel chains, non-tangential bevel chains and mixed bevel chains; and
   generate bevel profiles, via a bevel profile creation module for various bevel chains, single bevels and vertex bevels.

2. The computer-implemented product of claim 1, further comprising instructions to
   in response to input indicative of the top skin, bottom skin and other faces of the three-dimensional model of an object, identify, via the bevel feature recognition module, a boundary loop associated with the top skin, and the boundary loop defining inner and outer perimeters of the top skin;
   in response to the boundary loop being convex, tag the other faces connected to a boundary loop edge as first level faces;
   identify a coedge of the first level faces opposite the boundary loop edge of the top skin;
   quantify a number of levels between the top skin and a bottom skin of the three-dimensional model based on whether the coedge is the bottom skin;
   determine geometric properties including heights of the levels, widths of the levels, thickness of the part, or angles between the top skin and the levels;
   tag level faces between the top skin and bottom skin as feature faces belonging to a straight cut, v-bevel, k-bevel, x-bevel, y-bevel, generic bevel, inverted y-bevel, or inverted v-bevel based on the number of levels and geometric properties,
   wherein the straight cut is based on the number of levels being equal to one, the bounding loop edge and a bottom edge being convex, the height of first level face being equal to the thickness, and the angle of the level being equal to ninety degrees,
   wherein the V-bevel is based on the number of levels being equal to one, the bounding loop edge and bottom edge being convex, the height of the first level face being equal to the thickness, and the angle of the level being less than ninety degrees,
   wherein the inverted V-bevel is based on the number of levels being equal to one, the bounding loop edge and bottom edge being convex, the height of the first level face being equal to the thickness, and the angle of the level being greater than ninety degrees,
   wherein the Y-bevel is based on the number of levels being equal to two, all opposite edges being convex, the height of all level faces being equal to the thickness, a first level angle being less than ninety degrees, and a second level angle being equal to ninety degrees,
   wherein the inverted Y-bevel is based on the number of levels being equal to two, the bounding loop edge and all opposite edges being convex, the height of all level faces being equal to the thickness, the first level angle being equal to ninety degrees and the second level angle being greater than ninety degrees,
   wherein the X-bevel is based on the number of levels being equal to two, the bounding loop edge and all opposite edges being convex, the height of all level faces being equal to the thickness, the first level angle being less than ninety degrees, the second level angle being greater than first level angle, and the second level angle not being equal to ninety degrees,
   wherein the K-bevel is based on the number of levels being equal to three, the bounding loop edge and all opposite edges being convex, and the height of all level faces being equal to the thickness, and
   wherein the generic bevel is based on
      the number of levels being equal to two or three, the bounding loop edge and all opposite edges not being convex, and the height of all level faces being equal to thickness, or
      the number of levels being greater than three and the height of all level faces being equal to the thickness;
   perform vertex bevel checks based on the opposite edge of the first level face not being found,
   wherein the V-vertex bevel is recognized based on the first level face being a triangular face with three edges and an opposite vertex of the triangular face being connected to the bottom skin,
   wherein the X-vertex bevel is based on the opposite vertex of a first level triangular face being connected to another triangular face with one of its edges being connected to the bottom skin,
   wherein the Y-vertex bevel is based on the opposite vertex of the first level triangular face being shared by another edge that is connected to the bottom skin,
   wherein the K-vertex bevel is based on the opposite vertex of the first level triangular face being shared by another edge that is connected to another triangular face with one of its edges being connected to the bottom skin,
   wherein the Y-vertex bevel is based on the first level triangular face not being identified as the X-vertex bevel, V-vertex, Y-vertex bevel, or K-vertex bevel, wherein the inverted V-vertex bevel is based on the number of edges being connected to bounding loop vertex being equal to four and the bounding loop vertex being shared by the triangular face with one of its edges being connected to the bottom skin, wherein the inverted Y-vertex bevel is based on the number of edges being connected to the bounding loop vertex being equal to three and another vertex of the edge that does not belong to the bounding loop is shared by the triangular face with one of its edges being connected to the bottom skin; and tag remaining untagged triangular faces with an edge connected to bottom skin as inverted Y-vertex bevels.

3. The computer-implemented product of claim 1, further comprising instructions to recognize adjacent edges, via the bevel chain recognition module, attached to both ends of a bounding loop edge;

recognize edge continuity type of the adjacent edges with respect to the bounding loop edge including tangential continuity or non-tangential continuity;

tag the end of the bounding loop edge as an isolated end based on the adjacent edge of the bounding loop edge not being connected to a bevel feature;

tag the end of the bounding loop edge as a dissimilar end based on a bevel feature type and bevel parameters being connected to the bounding loop edge and the adjacent edge not being the same type;

tag the end of the bounding loop edge as a tangential end based on the bevel feature type and bevel parameters of the bevels being connected to the bounding loop edge and adjacent edge being the same type, and the continuity type between the bounding loop edge and adjacent edge being tangential;

tag the end of the bounding loop edge as a non-tangential end based on the bevel feature type and bevel parameters of the bevels connected to the bounding loop edge and the adjacent edge being the same type, and the continuity type between the bounding loop edge and the adjacent edge being non-tangential;

tag, as single bevels, bevels attached to the bounding loop edges with both bevel ends being isolated ends, both bevel ends being dissimilar ends, or one bevel end being the isolated end and another end being the dissimilar end;

tag all vertex bevels as single bevels;

identify the bounding loop edge having one end as the isolated end or dissimilar end and another end having the tangential end or non-tangential end, and tag the bevel attached to the bounding loop edge as a starting bevel of a bevel chain;

tag the bevel attached to any bounding loop edge as the starting bevel of the bevel chain based on none of the bounding loop edges having one end as the isolated end or dissimilar end;

tag the bevel attached to the adjacent edge connected to the tangential end or non-tangential end as a next bevel of the bevel chain until the other end is either the dissimilar end or isolated end, or all bounding loop edges are identified as connected bevels forming bevel chains;

tag the bevel chain as tangential bevel chains based on intermediate bevel ends of the bevel chain being tangential ends and a start and end bevel ends being tangential ends;

tag the bevel chain as non-tangential bevel chains based on intermediate bevel ends of the bevel chain being non-tangential ends and the start and end bevel ends being non-tangential ends;

tag the bevel chain as mixed bevel chains based on one or more intermediate bevel ends of the bevel chain being non-tangential ends and other intermediate bevel ends of the bevel chain being tangential ends;

tag the bevel chain as mixed bevel chains based on intermediate bevel ends of the bevel chain being tangential ends and the start and end bevel ends being non-tangential ends; and tag the bevel chain as mixed bevel chains based on the intermediate bevel ends of the bevel chain being non-tangential ends and the start and end bevel ends being tangential ends.

4. The computer-implemented product of claim 3, further comprising instructions to in response to the bevel chains, single bevels and vertex bevels recognized as V-bevel chain, V-bevel, V-vertex bevel, X-bevel chain, X-bevel, X-vertex bevel, Y-bevel chain, Y-bevel, Y-vertex bevel, K-bevel chain, K-bevel, K-vertex bevel, inverted V-bevel chain, inverted V-bevel, inverted V-vertex bevel, inverted Y-bevel chain, inverted Y-bevel, or inverted Y-vertex bevel, create, via the bevel profile creation module, a first level bevel profile by copying bounding loop edges of the bevels from the bevel feature recognition module;

extend next level faces and intersect with the top skin such that a next level profile for one or more subsequent levels is based on an intersection profile;

perform a bevel profile correction for non-tangential convex ends having a level angle less than ninety-degrees, dissimilar ends of non-tangential bevel chains, and mixed bevel chains;

perform the bevel profile correction based on a direction vector from a convex end of the bounding loop edge such that the direction vector is pointing towards the convex end from the other end of the bounding loop edge;

create perpendiculars from each vertex of the first level face to the direction vector of the bounding loop edge;

determine an intersection point between the perpendiculars and the direction vector, and extend the bevel profile to the farthest intersection point from the convex end along the direction vector of the bounding loop edge;

tag bevel profiles at non-tangential concave ends based on the level angle being less than ninety degrees, the dissimilar ends of non-tangential bevel chains, and mixed bevel chains;

in response to identifying the V-vertex bevels and Y-vertex bevels, create the bevel profile by copying bounding loop edges;

in response to identifying the inverted V-vertex bevels and inverted Y-vertex bevels, extend a bevel face to intersect with the top skin such that the bevel profile is equal to the intersection profile; and in response to identifying the X-vertex bevels and K-vertex bevels, create the first level bevel profile by copying the bounding loop edges, extending a second level bevel face to intersect the top skin, and utilizing the intersection profile as the second level bevel profile.

5. A computer-implemented product including instructions embodied in a non-transitory computer read-able medium that, when executed by a processor, cause the processor to receive a boundary representation model of a part;

in response to input indicative of a top skin, bottom skin, and other face of the boundary representation model of the part, identifying a boundary loop associated with the top skin and defining a perimeter of a topological feature of the part containing a first level face;

in response to the boundary loop being convex, identify a coedge of the first level face opposite a boundary loop edge of the top skin;

quantify a number of levels between the top skin and a bottom skin of the boundary representation model based on whether the coedge is the bottom skin; and tag the first level face as belonging to a straight cut, v-bevel, k-bevel, x-bevel, y-bevel, inverted y-bevel, or inverted v-bevel based on the number and geometric properties of the levels.

6. The computer-implemented product of claim 5, wherein the geometric properties are heights of the levels, widths of the levels, thicknesses of the part, or angles between the top skin and the levels.

7. The computer-implemented product of claim 6, further comprising instructions to calculate a height of the part based on a height calculated for each level and a slant height calculated for each level.

8. The computer-implemented product of claim 6, wherein the straight cut is based on the number of levels being equal to one and the geometric properties are such that the bounding loop edge and a bottom edge are convex, the heights of the first level face is equal to the thickness, and the angle of the level is equal to ninety degrees.

9. The computer-implemented product of claim 6, wherein the k-bevel is based on the number of levels being equal to three and the geometric properties are such that the bounding loop edge and all opposite edges are convex, and the height of all level faces are equal to thickness.

10. The computer-implemented product of claim 6, wherein the v-bevel is based on the number of levels being equal to one and the geometric properties are such that the bounding loop edge and a bottom edges are convex, the height of the first level face is equal to the thickness, and the angle of the level is less than ninety degrees.

11. The computer-implemented product of claim 6, wherein the inverted v-bevel is based on the number of levels being equal to one and the geometric properties are such that the bounding loop edge and bottom edge are convex, the height of the first level face is equal to the thickness, and the angle of the level is greater than ninety degrees.

12. The computer-implemented product of claim 6, further comprising instructions to, in response to a vertex bevel check based on an opposite edge of the first level face not being found, tag the first level face as a y-vertex bevel based on an opposite vertex of a first level triangular face being shared by another edge being connected to the bottom skin.

13. A computer-aided design tool comprising:
one or more processors programmed to
receive a boundary representation model of a part,
in response to input selecting a top skin of the boundary representation model of the part, identify a boundary loop associated with the top skin, bottom skin, and other faces and define a perimeter of a topological feature of the part containing a first level face,
in response to the boundary loop being convex, identify a coedge of the first level face opposite to the top skin, quantify a number of levels between the top skin and a bottom skin of the boundary representation model based on whether the coedge is the bottom skin, and tag the first level face as belonging to a straight cut, v-bevel, k-bevel, x-bevel, y-bevel, inverted y-bevel, or inverted v-bevel based on the number and geometric properties of the levels.

14. The computer-aided design tool of claim 13, wherein the geometric properties are a height of the levels, widths of the levels, an angle between the top skin and the levels, or a thickness of the part.

15. The computer-aided design tool of claim 14, wherein the number is equal to two and the geometric properties are such that the bounding loop edge and all opposite edges are convex, the height of all level faces are equal to the thickness, a first level angle between the first level face and the top skin is equal to ninety degrees and a second level angle between a second level face and the top skin is greater than ninety degrees when the first level face is tagged as the inverted y-bevel.

16. The computer-aided design tool of claim 14, wherein the number is equal to two and the geometric properties are such that the bounding loop edge and all opposite edges are convex, the height of all level faces are equal to the thickness, a first level angle between the first level face and the top skin is less than ninety degrees, a second level angle between a second level face and the top skin is greater than the first level angle, and the second level angle is not equal to ninety degrees when the first level face is tagged as the x-bevel.

17. The computer-aided design tool of claim 14, wherein the one or more processors are further programmed to tag the first level face as a generic bevel based on the number of levels being equal to two or three, the bounding loop edge and all opposite edges not being convex, and the height of all level faces being equal to the thickness, or the number of levels being greater than three and the height of all level faces being equal to the thickness.

18. The computer-aided design tool of claim 14, wherein the one or more processors are further programmed to, in response to a vertex bevel check based on an opposite edge of the first level face not being found, tag the first level face as the x-vertex bevel based on the opposite vertex of a first level triangular face being connected to another triangular face with one of its edges being connected to the bottom skin.

19. The computer aided design tool of claim 14, wherein the one or more processors are further programmed to, in response to a vertex bevel check based on an opposite edge of the first level face not being found, tag the first level face as the k-vertex bevel based on the opposite vertex of the first level triangular face being shared by another edge that is connected to another triangular face with one of its edges being connected to the bottom skin.

20. The computer-aided design tool of claim 14, wherein the number is equal to two and the geometric properties are such that the bounding loop edge and all opposite edges are convex, the height of all level faces are equal to the thickness, a first level angle between the first level face and the top skin is equal to ninety degrees and a second level angle between a second level face and the top skin is greater than ninety degrees when the first level face is tagged as the y-bevel.

* * * * *

UNITED STATES PATENT AND TRADEMARK OFFICE
CERTIFICATE OF CORRECTION

PATENT NO. : 9,811,610 B2
APPLICATION NO. : 14/631040
DATED : November 7, 2017
INVENTOR(S) : Thoguluva Ramamoorth Kannan et al.

Page 1 of 1

It is certified that error appears in the above-identified patent and that said Letters Patent is hereby corrected as shown below:

In the Claims

Column 31, Line 29, Claim 8:
After "bottom edge are convex, the"
Delete "heights" and
Insert -- height --.

Signed and Sealed this
Nineteenth Day of June, 2018

Andrei Iancu
*Director of the United States Patent and Trademark Office*